(12) United States Patent
Katumba et al.

(10) Patent No.: US 8,989,332 B2
(45) Date of Patent: *Mar. 24, 2015

(54) SYSTEMS AND METHODS FOR CONTROLLING FREQUENCY SYNTHESIS

(71) Applicant: Skyworks Solutions, Inc., Woburn, MA (US)

(72) Inventors: Rachel Nakabugo Katumba, Ottawa (CA); Darren Roger Frenette, Stittsville (CA); Ardeshir Namdar-Mehdiabadi, Ottawa (CA); John William Mitchell Rogers, Ottawa (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/191,404

(22) Filed: Feb. 26, 2014

(65) Prior Publication Data
US 2014/0177770 A1   Jun. 26, 2014

Related U.S. Application Data

(63) Continuation-in-part of application No. 13/870,742, filed on Apr. 25, 2013.

(60) Provisional application No. 61/639,042, filed on Apr. 26, 2012.

(51) Int. Cl.
*H03D 3/24* (2006.01)
*H03L 7/093* (2006.01)
(Continued)

(52) U.S. Cl.
CPC ............... *H03L 7/093* (2013.01); *H03L 7/197* (2013.01); *H04L 7/04* (2013.01); *H03L 7/1978* (2013.01)

USPC ........... 375/374; 375/376; 327/156; 327/157; 327/147; 331/1 A; 331/17

(58) Field of Classification Search
CPC ... H03L 7/0891; H03L 7/197; H04L 25/0282; H04L 7/04
USPC .................. 327/156, 157, 147; 375/376, 374; 331/1 A, 17
See application file for complete search history.

(56) References Cited

U.S. PATENT DOCUMENTS 6,011,822 A * 1/2000 Dreyer .......................... 375/376
2003/0224747 A1* 12/2003 Anand .......................... 455/208
(Continued)

OTHER PUBLICATIONS

Pamarti, S.; Jansson, L.; Galton, I., "A wideband 2.4-GHz delta-sigma fractional-NPLL with 1-Mb/s in-loop modulation," Solid-State Circuits, IEEE Journal of, vol. 39, No. 1, pp. 49,62, Jan. 2004.*
(Continued)

*Primary Examiner* — Daniel Washburn
*Assistant Examiner* — Amneet Singh
(74) *Attorney, Agent, or Firm* — Fernando Hale & Chang LLP

(57) ABSTRACT

Disclosed are systems and method for controlling frequency synthesizers. A control system can be implemented in a phase-locked loop (PLL), such as a Frac-N PLL of a frequency synthesizer, to reduce or eliminate reference spurs. In some embodiments, such a control system can include a phase detector configured to receive a reference signal and a feedback signal. The phase detector can be configured to generate a first signal representative of a phase difference between the reference signal and the feedback signal. The control system can further include a charge pump configured to generate a compensation signal based on the first signal. The control system can further includes an oscillator configured to generate an output signal based on the compensation signal. The compensation signal can be configured to reduce or substantially eliminate one or more reference spurs associated with the frequency synthesizer.

17 Claims, 16 Drawing Sheets

(51) Int. Cl.
*H03L 7/197* (2006.01)
*H04L 7/04* (2006.01)

(56) References Cited

U.S. PATENT DOCUMENTS

| | | | | |
|---|---|---|---|---|
| 2007/0075787 | A1* | 4/2007 | Jensen | 331/17 |
| 2007/0182611 | A1* | 8/2007 | Yu | 341/143 |
| 2007/0229130 | A1* | 10/2007 | Lee et al. | 327/157 |
| 2008/0048791 | A1* | 2/2008 | Fahim | 331/1 A |
| 2008/0129352 | A1* | 6/2008 | Zhang | 327/157 |
| 2009/0115473 | A1* | 5/2009 | Choi et al. | 327/157 |
| 2009/0251225 | A1* | 10/2009 | Chen et al. | 331/1 A |
| 2010/0039182 | A1* | 2/2010 | Galton et al. | 331/1 A |
| 2011/0050301 | A1 | 3/2011 | Perrott | |
| 2011/0290987 | A1* | 12/2011 | Liu et al. | 250/214 AL |
| 2013/0027098 | A1* | 1/2013 | Wang et al. | 327/156 |
| 2013/0027100 | A1* | 1/2013 | Yaghini et al. | 327/156 |
| 2013/0027102 | A1* | 1/2013 | Chen et al. | 327/158 |

OTHER PUBLICATIONS

Perrott, M.H.; Trott, M.D.; Sodini, C.G., "A modeling approach for Σ-Δ fractional-N frequency synthesizers allowing straightforward noise analysis," Solid-State Circuits, IEEE Journal of, vol. 37, No. 8, pp. 1028,1038, Aug. 2002.*

Jaewook Shin; Hyunchol Shin, "A Fast and High-Precision VCO Frequency Calibration Technique for Wideband Delta-Sigma Fractional-N Frequency Synthesizers," Circuits and Systems I: Regular Papers, IEEE Transactions on , vol. 57, No. 7, pp. 1573,1582, Jul. 2010.*

Temporiti, E.; Albasini, G.; Bietti, I; Castello, R.; Colombo, M., "A 700-kHz bandwidth ΣΔ fractional synthesizer with spurs compensation and linearization techniques for WCDMA applications," Solid-State Circuits, IEEE Journal of , vol. 39, No. 9, pp. 1446,1454, Sep. 2004.*

Thambidurai, C.; Krishnapura, N., "Spur reduction in wideband PLLs by random positioning of charge pump current pulses," Circuits and Systems (ISCAS), Proceedings of 2010 IEEE International Symposium on , vol., No., pp. 3397,3400, May 30, 2010-Jun. 2, 2010.*

Wang, K.J.; Swaminathan, A; Galton, I, "Spurious Tone Suppression Techniques Applied to a Wide-Bandwidth 2.4 GHz Fractional-N PLL," Solid-State Circuits, IEEE Journal of , vol. 43, No. 12, pp. 2787,2797, Dec. 2008.*

Hedayati et al., "Closed-Loop Nonlinear Modeling of Wideband Sigma Delta Fractional-N Frequency Synthesizers," Microwave Theory and Techniques, IEEE Transactions on Microwave Theory and Techniques, vol. 54, No. 10, pp. 3654-3663, Oct. 2006.

Le Brun, "A Derivation of the Spectrum of FM with a Complex Modulating Wave," Computer Music Journal, vol. 1, No. 4, pp. 51-52, Nov. 1977.

Yan et al., "An accurate and fast behavioral model for PLL Frequency Synthesizer phase noise/spurs prediction," IEEE 2009 Custom Integrated Circuits Conference (CICC), pp. 223-226, Sep. 2009.

Cassia et al., "Analytical model and behavioral simulation approach for a ΣΔ fractional-N synthesizer employing a sample-hold element," Circuits and Systems II: Analog and Digital Signal Processing, IEEE Transactions on Circuits and Systems, vol. 50, No. 11, pp. 850-859, Nov. 2003.

Butterfield et al., "Prediction of fractional-N spurs for UHF PLL frequency synthesizers," Technologies for Wireless Applications, IEEE MTT-S Symposium, pp. 29-34, Feb. 1999.

Riley et al., "Delta-sigma modulation in fractional-N frequency synthesis," Solid-State Circuits, IEEE Journal of Solid-State Circuits, vol. 28, No. 5, pp. 553-559, May 1993.

Borkowski et al., "A practical Δ-Σ modulator design method based on periodical behavior analysis," IEEE Transactions on Circuits and Systems II, vol. 52, No. 10, pp. 626-630, Oct. 2005.

\* cited by examiner

SYSTEMS AND METHODS FOR CONTROLLING FREQUENCY SYNTHESIS

CROSS-REFERENCE TO RELATED APPLICATIONS

This application is a continuation-in-part of U.S. application Ser. No. 13/870,742 filed Apr. 25, 2013 entitled CIRCUITS AND METHODS FOR ELIMINATING REFERENCE SPURS IN FRACTIONAL-N FREQUENCY SYNTHESIS, which claims priority to and the benefit of the filing date of U.S. Provisional Application No. 61/639,042 filed Apr. 26, 2012 entitled SPURIOUS TONE PREDICTION AND REFERENCE SPUR/INTEGER BOUNDARY SPUR ERADICATION OF FRACTIONAL-N PLLS, the benefits of the filing dates of which are hereby claimed and the disclosures of which are hereby expressly incorporated by reference in their entirety.

BACKGROUND

1. Field

The present disclosure generally relates to circuits and method for reducing or eliminating reference spurs in fractional-N frequency synthesis in radio-frequency (RF) applications.

2. Description of the Related Art

A radio-frequency (RF) communication system typically relies on one or more operating frequencies. A clean and stable signal having a desired operating frequency is highly desirable.

In many RF systems, a frequency synthesizer can provide a signal with an operating frequency through use of a phase-locked loop (PLL). In many operating situations, a PLL can suffer from undesirable effects such as phase noise or spurious tones (spurs). Phase noise typically refers to small variations from the intended operating frequency. Spurs are typically large unwanted frequency components that manifest themselves at some offset of the operating frequency.

SUMMARY

In some implementations, the present disclosure relates to a phase-locked loop (PLL) circuit for a frequency synthesizer of a wireless device. The PLL circuit includes a phase frequency detector (PFD) configured to receive a reference signal and a feedback signal. The PFD is further configured to generate a first signal representative of a phase difference between the reference signal and the feedback signal. The PLL further includes a compensation circuit in communication with the PFD. The compensation circuit is configured to generate a compensation signal based on the first signal. The PLL further includes a voltage-controlled oscillator (VCO) in communication with the compensation circuit. The VCO is configured to generate an output signal based on the compensation signal. The compensation signal includes at least one feature for substantially eliminating one or more reference spurs associated with the PLL.

In some embodiments, the compensation circuit can include a charge pump configured to receive the first signal and generate a current signal to compensate for the phase difference. The compensation circuit can further include a loop filter configured to receive the current signal and generate a corresponding voltage signal, with the voltage signal being provided to the VCO.

In some embodiments, the at least one feature of the compensation signal can include the current signal having a pulse with a substantially constant width and an amplitude representative of the phase difference. The PFD can be configured to generate an up signal or a dn as the first signal, with the up signal being generated when a phase of the reference signal leads a phase of the feedback signal, and the dn signal being generated when a phase of the reference signal lags a phase of the feedback signal. The compensation circuit can include a charging circuit in communication with the PFD. The charging circuit can be configured to charge a capacitance element upon receipt of the first signal, with the charged capacitance having a voltage representative of the phase difference. The charging circuit can include a charging switch configured to facilitate the charging of the capacitance element, and a drain switch configured to facilitate draining of the charge in the capacitance element.

In some embodiments, the compensation circuit can further include a voltage-to-current converter in communication with the charging circuit. The voltage-to-current converter can be configured to generate a control signal in response to the voltage of the charged capacitance element. The charge pump can be in communication with the voltage-to-current converter, with the charge pump being configured to generate the current signal based on the control signal from the voltage-to-current converter. The charge pump can include a first current source configured to generate a positive current as the current signal for the up signal and a second current source configured to generate a negative current as the current signal for the dn signal. The current signal can be modulated based on a combination of the up signal and a pulse signal or a combination of the dn signal and the pulse signal.

In some embodiments, the compensation circuit can further include a first switch in communication with the first current source and a second switch in communication with the second current source, with the first and second switches being configured to be controlled to provide the modulation of the current signal. In some embodiments, the first switch or the second switch can be engaged only when the capacitance element has a substantially full charge. In some embodiments, the charging switch is not engaged if either of the first switch and the second switch is engaged.

In some embodiments, the compensation circuit can further include a first control block in communication with the first switch and a second control block in communication with the second switch. The first control block can be configured to generate a first enable pulse for the first switch based on a combination of the up signal and the pulse signal. The second control block can be configured to generate a second enable pulse for the second switch based on a combination of the dn signal and the pulse signal. Each of the first and second control blocks can be configured to generate in internal signal that goes high with a rising edge of a respective one of the up and dn signals. The internal signal can be further configured to go low with a falling edge of the pulse signal. Each of the first and second control blocks can be further configured to combine the internal signal with the pulse signal to yield a respective one of the first and second enable signals. Each of the first and second control blocks can be configured to perform an AND operation to combine the internal signal with the pulse signal. The pulse signal can include a plurality of pulses, with each pulse having a substantially constant width and going high with a falling edge of the reference signal.

In some embodiments, the PLL circuit can further includes a divider circuit in communication with the VCO and the PFD. The divider circuit can be configured to receive the output signal from the VCO and generate an updated version of the feedback signal. The PLL can be a Frac-N PLL. The PLL can further include a sigma delta modulator (SDM) in communication with the divider circuit to form a loop. The loop can be configured to allow the output signal to have an output frequency that is a non-integer multiple of the frequency of the reference signal.

In accordance with a number of implementations, the present disclosure relates to a method for operating a phase-locked loop (PLL) of a frequency synthesizer in a wireless device. The method includes receiving a reference signal and a feedback signal. The method further included generating a first signal representative of a phase difference between the reference signal and the feedback signal. The method further includes generating a compensation signal based on the first signal. The method further includes generating an output signal based on the compensation signal. The compensation signal includes at least one feature for substantially eliminating one or more reference spurs associated with the PLL.

In a number of implementations, the present disclosure relates to a radio-frequency (RF) module that includes a packaging substrate configured to receive a plurality of components. The module further includes one or more die mounted on the packaging substrate. The one or more die include a frequency synthesizer circuit, with the frequency synthesizer circuit having a phase-locked loop (PLL) circuit. The PLL includes a phase frequency detector (PFD) configured to receive a reference signal and a feedback signal. The PFD is further configured to generate a first signal representative of a phase difference between the reference signal and the feedback signal. The PLL further includes a compensation circuit in communication with the PFD. The compensation circuit is configured to generate a compensation signal based on the first signal. The PLL further includes a voltage-controlled oscillator (VCO) in communication with the compensation circuit. The VCO is configured to generate an output signal based on the compensation signal. The compensation signal includes at least one feature for substantially eliminating one or more reference spurs associated with the PLL.

In some implementations, the present disclosure relates to a wireless device that includes an antenna configured to facilitate reception of a radio-frequency (RF) signal. The wireless device further includes a receiver in communication with the antenna, with the receiver being configured to process the RF signal. The wireless device further includes a frequency synthesizer in communication with the receiver, with the frequency synthesizer circuit having a phase-locked loop (PLL) circuit. The PLL includes a phase frequency detector (PFD) configured to receive a reference signal and a feedback signal. The PFD is further configured to generate a first signal representative of a phase difference between the reference signal and the feedback signal. The PLL further includes a compensation circuit in communication with the PFD. The compensation circuit is configured to generate a compensation signal based on the first signal. The PLL further includes a voltage-controlled oscillator (VCO) in communication with the compensation circuit. The VCO is configured to generate an output signal based on the compensation signal. The compensation signal includes at least one feature for substantially eliminating one or more reference spurs associated with the PLL.

In some embodiments, the wireless device can further include a transmitter in communication with the antenna. The transmitter can be configured to generate a transmit signal.

In accordance with a number of implementations, the present disclosure relates to a control system for a frequency synthesizer of a wireless device. The control system includes a phase detector configured to receive a reference signal and a feedback signal. The phase detector is further configured to generate a first signal representative of a phase difference between the reference signal and the feedback signal. The control system further includes a charge pump in communication with the phase detector. The charge pump is configured to generate a compensation signal based at least in part on the first signal. The control system further includes an oscillator in communication with the charge pump. The oscillator is configured to generate an output signal based on the compensation signal. The compensation signal is configured to reduce or substantially eliminate one or more spurs associated with the frequency synthesizer.

In some embodiments, the one or more spurs can include one or more reference spurs. In some embodiments, the compensation signal can include a current signal to compensate for the phase difference. In some embodiments, the control system can further include a loop filter configured to receive the current signal and generate a corresponding voltage signal, with the voltage signal being provided to the oscillator. The oscillator can include a voltage-controlled oscillator (VCO). The current signal can include a pulse with a substantially constant width and an amplitude representative of the phase difference.

In some embodiments, the phase detector can be configured to generate an UP signal or a DN as the first signal, with the UP signal being generated when a phase of the reference signal leads a phase of the feedback signal, and the DN signal being generated when a phase of the reference signal lags a phase of the feedback signal. The charge pump can include a charging circuit in communication with the phase detector. The charging circuit can be configured to charge a capacitance element upon receipt of a charge signal, with the charged capacitance having a voltage representative of the phase difference. The charge signal can result from an AND operation between the first signal and an inverse of a switch signal corresponding to the first signal. The switch signal can be configured to allow the loop filter to receive the current signal. The charging circuit can include a charging switch configured to facilitate the charging of the capacitance element, and a drain switch configured to facilitate draining of the charge in the capacitance element. The charging switch and the drain switch can be in their respective states to inhibit charging of the capacitance element and to inhibit draining of the capacitance element, respectively, when the loop filter is receiving the current signal.

In some embodiments, the charge pump can include a first current source configured to generate a positive current as the current signal for the UP signal and a second current source configured to generate a negative current as the current signal for the DN signal. The current signal can be modulated based on a combination of the UP signal and a pulse signal or a combination of the DN signal and the pulse signal. The pulse signal can be generated from the reference signal such that the pulse signal has substantially same frequency as the reference signal. The combination of the UP signal and the pulse signal can include an AND combination of the pulse signal and an UP_TOGGLE signal that results from a flip-flop operation between the UP signal and an inverse of the pulse signal. The combination of the DN signal and the pulse signal can include an AND combination of the pulse signal and a DN_TOGGLE signal that results from a flip-flop operation between the DN signal and an inverse of the pulse signal. The charge pump can further include a first switch in communication with the first current source and a second switch in communication with the second current source. The first and second switches can be configured to be controlled to provide the modulation of the current signal. The first switch or the second switch can be configured to be engaged only when the capacitance element has a substantially full charge.

In some embodiments, the control system can further include a divider circuit in communication with the oscillator and the phase detector. The divider circuit can be configured to receive the output signal from the oscillator and generate an updated version of the feedback signal. The control system can further include a sigma delta modulator (SDM) in communication with the divider circuit to form a loop. The loop can be configured to allow the output signal to have an output frequency that is a non-integer multiple of the frequency of the reference signal.

In a number of implementations, the present disclosure relates to a wireless device that includes an antenna configured to facilitate reception of a radio-frequency (RF) signal. The wireless device further includes a receiver in communication with the antenna. The receiver is configured to process the RF signal. The wireless device further includes a frequency synthesizer in communication with the receiver. The frequency synthesizer circuit includes a control system. The control system includes a phase detector configured to receive a reference signal and a feedback signal. The phase detector is further configured to generate a first signal representative of a phase difference between the reference signal and the feedback signal. The control system further includes a charge pump in communication with the phase detector. The charge pump is configured to generate a compensation signal based at least in part on the first signal. The control system further includes an oscillator in communication with the charge pump. The oscillator is configured to generate an output signal based on the compensation signal. The compensation signal is configured to reduce or substantially eliminate one or more spurs such as reference spurs associated with the frequency synthesizer.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
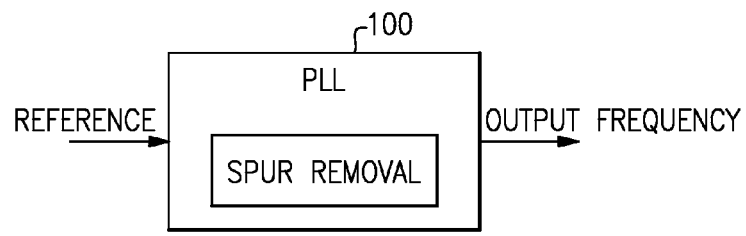
FIG. 1 schematically depicts a phase-locked loop (PLL) having a spur removal component.

In some embodiments, a radio-frequency (RF) device such as a wireless device can include a frequency synthesizer having a phase-locked loop (PLL). FIG. 1 schematically depicts a PLL 100 that can be configured to receive a reference signal and generate an output signal having a desired output frequency. Such a PLL can include a spur removal component having one or more desirable features as described herein. Such a spur removal component is sometimes described herein as a compensation circuit, a compensation component, and the like.

In some embodiments, a PLL having one or more features of the present disclosure can be implemented in a radio-frequency (RF) device such as a wireless device. Such a wireless device can include, for example, a cellular phone, a smart-phone, a hand-held wireless device with or without phone functionality, a wireless tablet, etc. Although described in the context of a wireless device, it will be understood that one or more features of the present disclosure can also be implemented in other RF systems, including, for example, a base-station.

Figure 2:
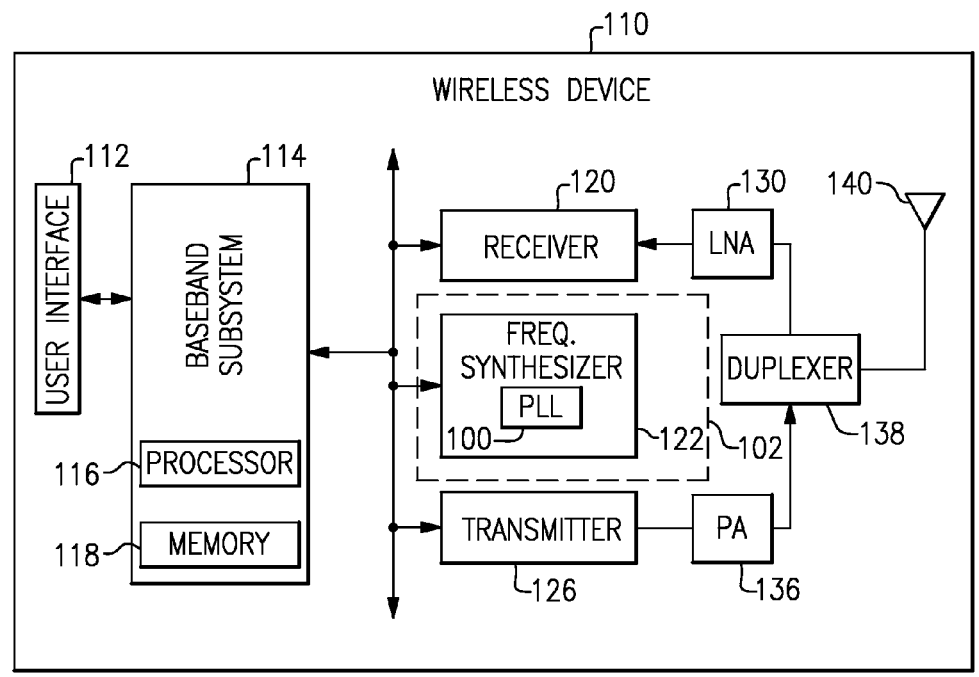
FIG. 2 shows a wireless device in which the PLL of FIG. 1 can be implemented.

FIG. 2 schematically depicts an example wireless device 110 having one or more advantageous features described herein. The wireless device 110 is shown to include an antenna 140 configured to facilitate transmission (Tx) and/or reception (Rx) of RF signals. Such Tx and/or Rx operations can be performed simultaneously by use of a duplexer 138. Although described in the context of such duplex functionality and common antenna, other configurations are also possible.

A received signal is shown to be routed from the antenna 140 to a receiver circuit 120 via the duplexer 138 and a low-noise amplifier (LNA) 130. For transmission, a signal to be transmitted is shown to be generated by a transmitter circuit 126 and routed to the antenna 140 via a power amplifier (PA) 136 and the duplexer 118. The receiver circuit 120 and the transmitter circuit 126 may or may not be part of a same component (e.g., a transceiver). In some embodiments, a wireless device 110 can include both of the receiver and transmitter circuits, or just one circuit (e.g., receiver or transmitter).

The wireless device 110 is shown to further include a frequency synthesizer circuit 122 having a phase-locked loop (PLL) 100. Such a circuit (122) can include one or more features as described herein to provide advantages for either or both of Rx and Tx functionalities associated with the wireless device 110.

The receiver circuit 120, the transmitter circuit 126, and the frequency synthesizer circuit 122 are shown to be in communication with a baseband subsystem 114 which can include, for example, a processor 116 configured to control a number of operations associated with the wireless device 110, and a memory 118 configured to store data, executable instructions, etc. The baseband subsystem 114 is also shown to be in communication with a user interface 112 to allow interfacing of various functionalities of the wireless device 110 with a user.

As shown in FIG. 2, at least some of the one or more features associated with the frequency synthesizer 122 can be implemented in an RF module 102. Such a module can include a packaging substrate configured to receive a plurality of components. The module 102 can include one or more semiconductor die mounted on the packaging substrate. Such one or more die can include some or all of the circuit that provides various functionalities associated with the frequency synthesizer 122.

Figure 3:
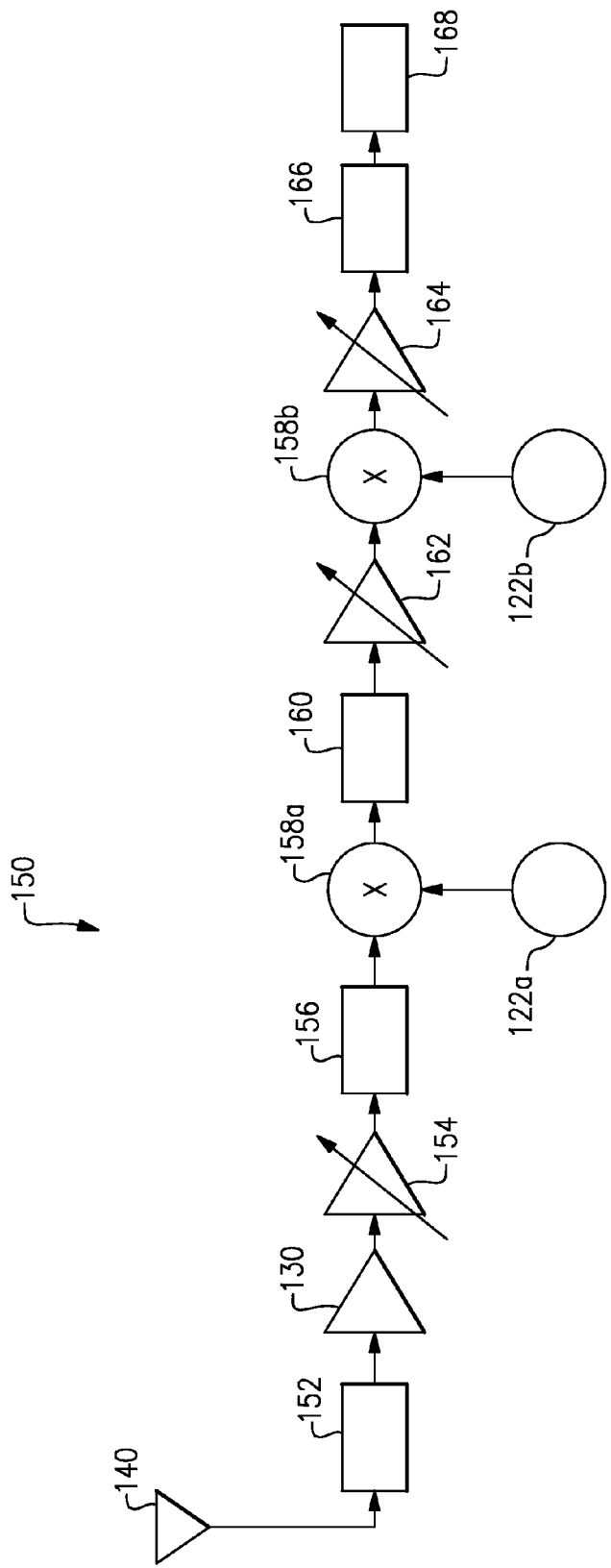
FIG. 3 shows that in some embodiments, the PLL of FIG. 1 can be implemented in a frequency synthesizer that facilitates processing of a received radio-frequency (RF) signal.

FIG. 3 shows an example configuration 150 where one or more frequency synthesizers can be implemented in a receiver chain of a wireless device. Although described in such a receiver chain context, it will be understood that one or more features of the present disclosure can also be implemented in other parts of a wireless device.

A signal received by the antenna 140 can be passed through a preselect filter 152 configured to pass a desired receive band. The preselect filter 152 can work in conjunction with an image filter 156 to further isolate the receive band. Both of these filters can pass substantially the entire receive band, since channel selection does not occur until more downstream of the receiver chain.

A low-noise amplifier (LNA) 130 can be implemented to boost the incoming signal. Such an LNA can be configured to provide this gain while degrading the signal-to-noise ratio (SNR) as little as possible. An automatic gain control (AGC) circuit 154 can be configured to allow the wireless device to handle a wide range of expected input power levels. For example, a low powered incoming signal can require a greater boost than a higher powered incoming signal.

A first mixer 158a can be configured to convert the RF channels down to lower frequencies and center a desired channel at a specific intermediate frequency (IF). Such a specific IF can be provided to the first mixer 158a from a first frequency synthesizer 122a.

At this stage, the entire received-and-filtered band is now mixed down to the IF. An IF filter 160 can be configured to isolate the channel of interest from the receive band. An AGC circuit 162 can be configured to allow the wireless device to handle a wide range of expected input power levels associated with the isolated channel of interest.

A second mixer 158b can be configured to convert the foregoing isolated channel signal down to a baseband signal. Such down-conversion can be facilitated by a second frequency synthesizer 122b configured to generate and provide a desired baseband frequency to the second mixer 158b.

An AGC circuit 164 can be configured to allow the wireless device to handle a wide range of expected input power levels associated with the output of the second mixer 158b. A baseband filter 166 can be configured to filter the selected baseband-frequency signal before having the signal sampled by an analog-to-digital converter (ADC) 168. A digital signal resulting from such an ADC can be passed to a baseband sub-system (not shown in FIG. 3).

In the context of the example signal processing configuration of FIG. 3, the first frequency synthesizer 122a generates a clock signal that facilitates the down-conversion of a received signal to an IF signal. Similarly, the second frequency synthesizer 122b generates a clock signal that facilitates the down-conversion of the IF signal to a baseband signal.

As described in reference to FIGS. 1 and 2, a frequency synthesizer can include a PLL. In some embodiments, a PLL can be implemented as a negative feedback control system designed to generate an output at a particular frequency. Such an output can be utilized as an output of the frequency synthesizer.

Figure 4:
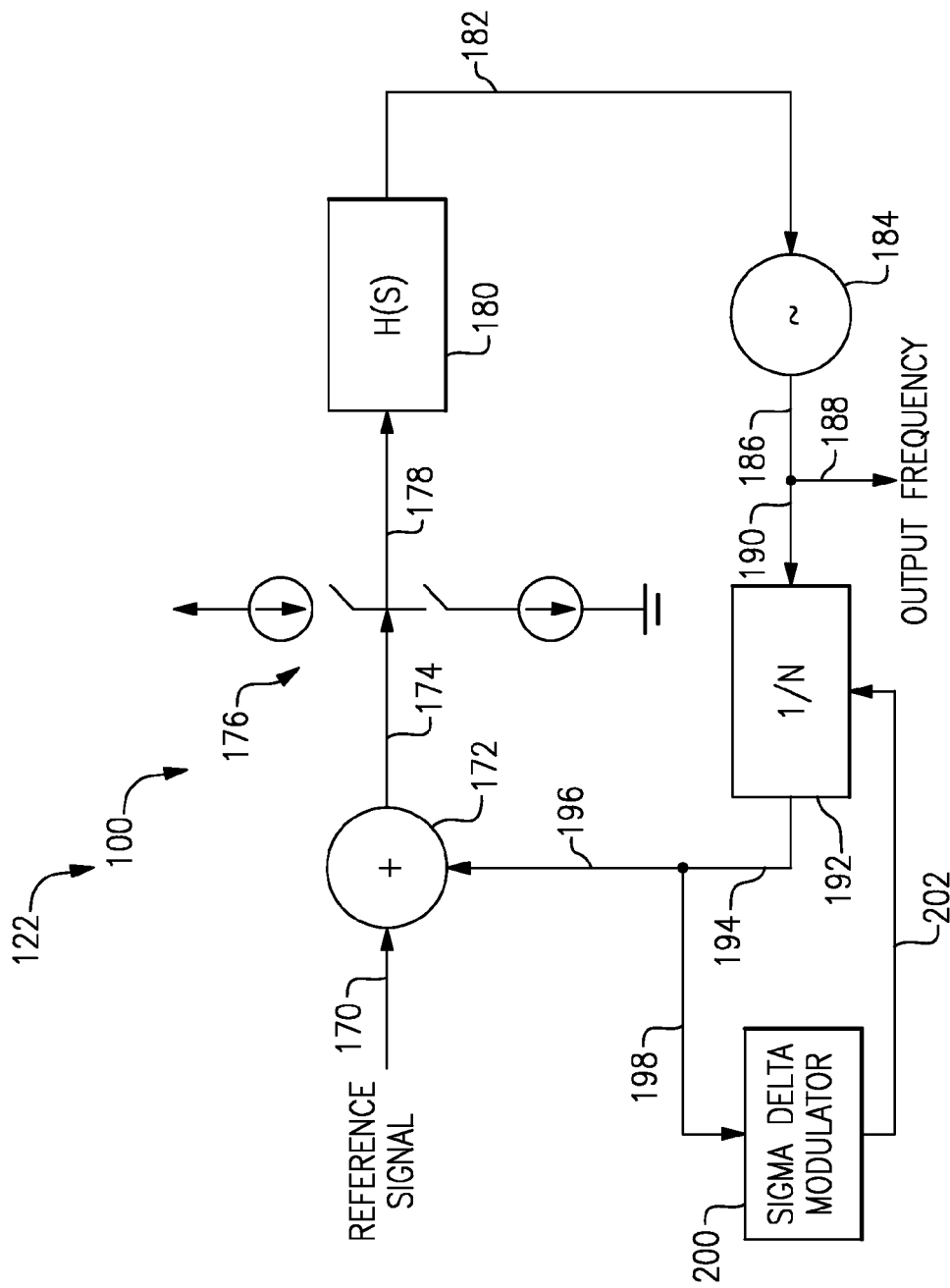
FIG. 4 shows an example PLL that is capable of operating as a Frac-N PLL.

FIG. 4 shows an example configuration of a PLL circuit 100 which can be a part of a frequency synthesizer 122. As shown, an input 170 into the PLL 100 is a reference signal which is typically provided from a crystal oscillator (not shown) to a phase frequency detector (PFD) 172. In some embodiments, the PFD 172 can be configured to compare the rising edges of the reference signal and a feedback signal (in path 196) and determine if the feedback signal is leading or lagging with respect to the reference signal. Based on this comparison, the PFD 172 can output a signal to a charge pump 176 (through path 174). In response, the charge pump 176 can output a current which is related to the phase difference between the reference and feedback signals.

The foregoing charge pump current can be provided to a loop filter 180 (through path 178). The loop filter 180 can be configured to convert the charge pump current into a voltage suitable for driving a voltage controlled oscillator (VCO) 184 (through path 182). The loop filter 180 can also be configured to control loop dynamics of the PLL (e.g., bandwidth, settling time, etc.).

The VCO 184 can be configured to output a signal (through path 186) having a frequency that is related to the driving voltage from the loop filter 180. In some embodiments, such an output of the VCO 184 can also be an output of the PLL 100 (through path 188). Accordingly, VCO output and PLL output are sometimes used interchangeably in the description herein.

The output of the VCO 184 can be fed into a divider circuit 192 (through path 192). The divider circuit 192 can be configured to divide the VCO output frequency back down to the reference frequency. A feedback signal from the divider circuit 192 can be fed back into the PFD 172 (through paths 194, 196) to thereby complete the PLL loop.

The foregoing feedback mechanism allows the output frequency of the PLL to lock on to a frequency that is a multiple of the reference signal frequency. If the multiple is an integer, the PLL is considered to be an Integer-N PLL. If the multiple contains a fractional component, the PLL is considered to be a Frac-N PLL (or Fractional-N PLL).

FIG. 4 further shows a sigma delta modulator (SDM) 200 in communication with the above-described feedback loop. As described herein, such an SDM can be configured as an additional feedback loop with the divider circuit 192 (through paths 194, 198 from the divider circuit 192 to the SDM 200, and through path 202 from the SDM 200 to the divider circuit 192) to allow the PLL 100 to operate as a Frac-N PLL.

In some embodiments, the SDM 200 can be configured to generate a signal that instructs the divider circuit 192 with which integer value to divide the frequency of the VCO output signal. By way of an example, suppose that a PLL has a reference signal frequency of 40 MHz, and it is desired to output a signal having a frequency of 2.41 GHz. Such a configuration yields a divide ratio of 60 and ¼. One way the PLL can achieve this divide ratio is to implement dividing by 60 for three reference cycles, then dividing by 61 for one cycle. This pattern can then repeat. Over each repetition the average divide value, $N_{avg}$, is 60 and ¼ as expected.

In the context of the foregoing example, the SDM 200 can instruct the divider circuit 192 to divide by 60 or 61. Such dithering between two integer divide ratios can allow the divider circuit 192 to be implemented even if the circuit (192) is only capable of integer division. Accordingly, the output frequency of such a Frac-N PLL can be an averaged result of a plurality of integer divide values.

It is noted that the output resolution can be dependent on the divide ratio and not on the reference clock. In another example, now suppose that the desired output frequency is 2.405 GHz which has a greater resolution than the foregoing example of 2.41 GHz. Such a frequency can be synthesized by changing the divide ratio from 60 and ¼ to 60 and ⅛.

FIGS. 5-9 show example configurations and/or characteristics of the various components of the PLL 100 of FIG. 4. FIG. 5A schematically depicts an example configuration where the PFD 172 is working in concert with the charge pump 176 to produce pulses of current ($i_{CP}$) which are proportional to the phase difference between the reference signal (170) and the feedback signal (196).

Figure 5A:
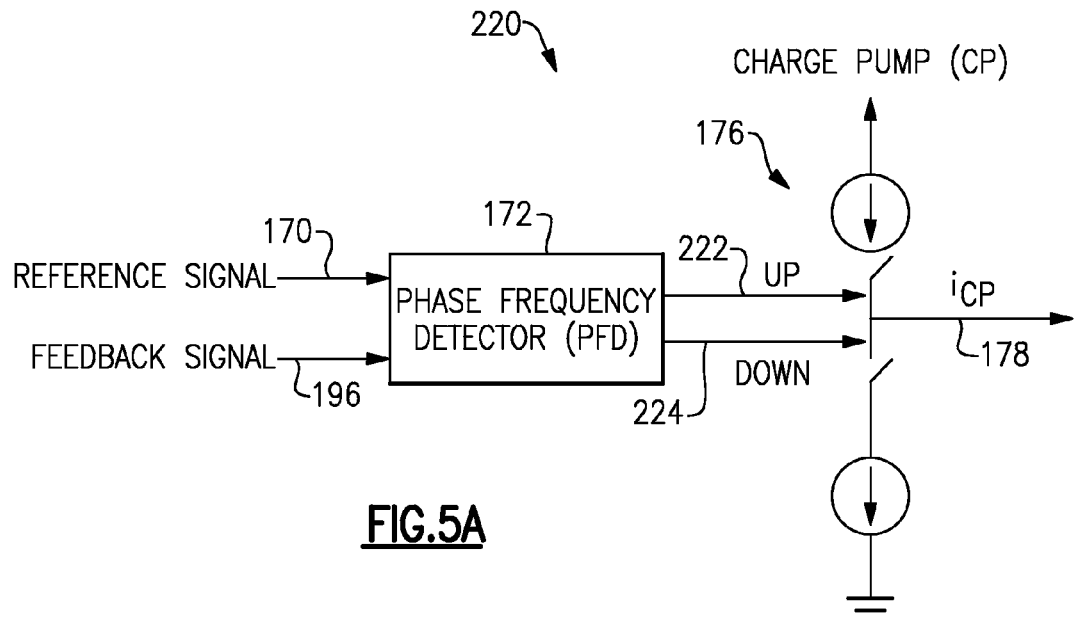
FIGS. 5A and 5B show an example charge pump that can be implemented in the PLL of FIG. 4, and an example operating configuration of the charge pump.

The pulses of current, $i_{CP}$, generated by the charge pump 176 (to path 178), can alter the tuning voltage of the VCO (not shown in FIG. 5A). Consequently, the phase of the feedback signal emerging from the VCO can be either increased or decreased to more closely match the reference phase.

Figure 5B:
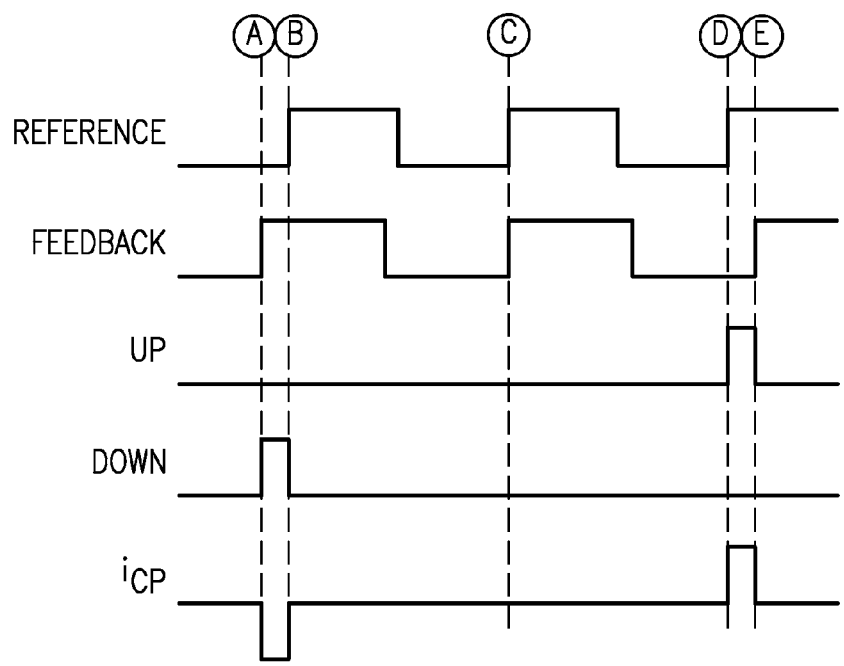

FIG. 5B shows an example of how the PFD 172 and the charge pump 176 can operate. At time A the feedback signal is shown to go high before the reference signal. This can indicate that the feedback signal is leading the reference signal. For such a situation, the VCO output frequency can be decreased, to effectively delay the feedback signal. To accomplish such a response, the PFD 172 can issue a DOWN pulse (224) until time B at which the reference signal has its rising edge. Until the next rising edge (e.g., at time C) of either the reference or feedback signals, the PFD 172 can become inactive. At time C, since both rising edges of the reference and feedback signals occur substantially simultaneously, there is no UP or DOWN signal being issued by the PFD 172. At time D, the reference signal is now depicted as leading the feedback signal. Accordingly, an UP pulse (222) can be issued by the PFD 172 during a period between times D and E to thereby increase the VCO output frequency.

Figures 6A, 6B:
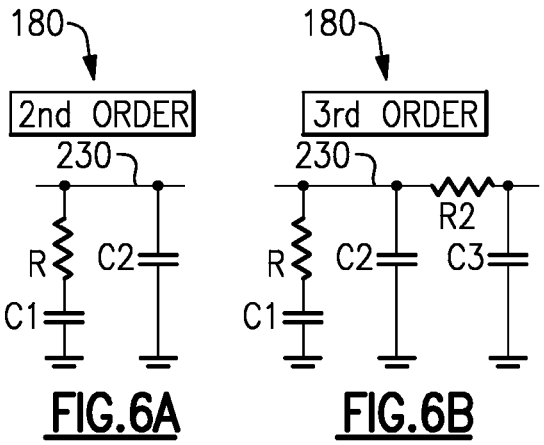
FIGS. 6A and 6B show examples of a loop filter that can be implemented in the PLL of FIG. 4.

FIGS. 6A and 6B show examples of filters that can be implemented for the loop filter 180 described in reference to FIG. 4. In some embodiments, such a loop filter can be configured to provide a plurality of functionalities. For example, the loop filter 180 can be configured to convert the charge pump current (e.g., $i_{CP}$ in FIG. 5A) into a voltage suitable for driving the VCO (184 in FIG. 4). In another example, the loop filter can be configured to control the loop dynamics of the PLL 100 (e.g., bandwidth, settling time, etc.).

FIG. 6A shows that in some embodiments, a second-order passive filter can be implemented in the loop filter 180. Such a passive filter can include first and second paths to a ground from a signal path 230. The first path can include resistance R and capacitance C1 connected in series between the signal path 230 and the ground. The second path can include capacitance C2 between the signal path 230 and the ground.

FIG. 6B shows that in some embodiments, a third-order passive filter can be implemented in the loop filter 180. Such a passive filter can include first, second, and third paths to a ground from a signal path 230. The first path can include resistance R and capacitance C1 connected in series between the signal path 230 and the ground. The second path can include capacitance C2 between the signal path 230 and the ground. The third path can include capacitance C3 between the signal path 230 and the ground.

Figure 7:
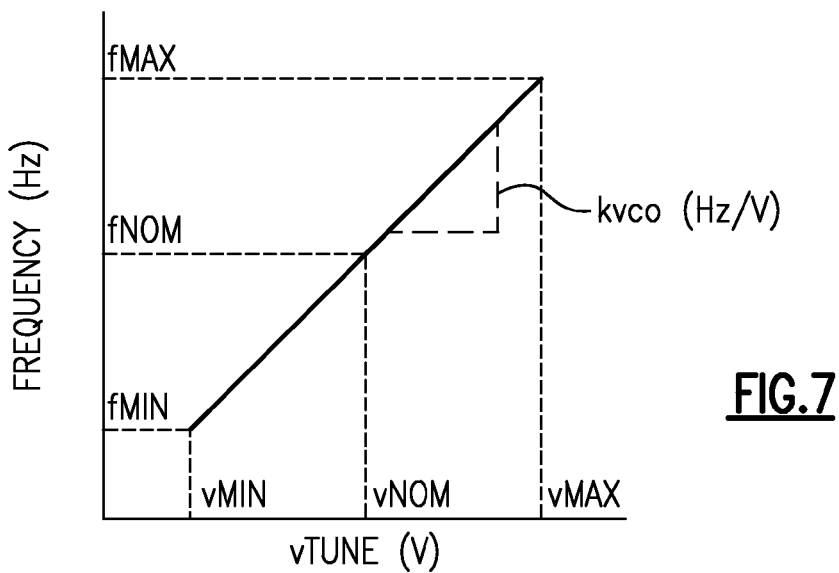
FIG. 7 shows an example characteristics of a voltage controlled oscillator (VCO) that can be implemented in the PLL of FIG. 4.

FIG. 7 shows an example response that the VCO (184) of FIG. 4 can be configured to generate. In some embodiments, a VCO can be an oscillator whose output frequency is related to its input voltage. FIG. 7 shows that in some embodiments, such voltage-dependence of the output frequency can be a linear or approximately linear relationship. One can see that as the tuning voltage ($v_{Tune}$) increases, the output frequency increases proportionally within a given range. For example, a VCO can have a range of voltages over which it can operate. This range is shown as $v_{Min}$ to $v_{Max}$, with $v_{Nom}$ being a nominal voltage at which the VCO operates.

As further shown in FIG. 7, a slope parameter $k_{vco}$ can be expressed in units of Hz/V. In some situations, it can also be expressed in radians/Sec/V. In some embodiments, a VCO can be configured so that with no input voltage to the VCO (e.g., $v_{Tune}=0$), the output is the nominal frequency, $f_{nom}$. The control voltage $v_{Tune}$ can be applied to move the output frequency away from the nominal frequency. For example, an instantaneous frequency ($f_{vco}$) of the VCO can be generated as $f_{vco}=f_{nom}+k_{vco}v_{tune}$.

Figure 8:
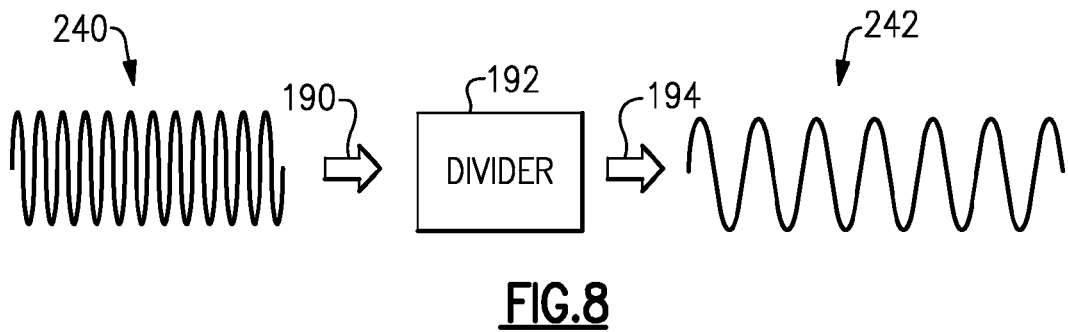
FIG. 8 shows an example divider that can be implemented in the PLL of FIG. 4.

FIG. 8 depicts an example of how the divider circuit 192 of FIG. 4 can be configured to reduce the frequency of an input signal 240 (through input path 190) to yield an output signal 242 (through output path 194) having a reduced frequency. In some embodiments, as described herein, the divider circuit 192 can be configured to receive an output of the VCO (184 in FIG. 4) and divide the frequency of the VCO-output signal by whatever integer it is programmed with. As also described herein, non-integer division values of the divider circuit 192 can also be implemented with use of the SDM (200 in FIG. 4) so as to facilitate a Frac-N PLL configuration.

Figure 9:
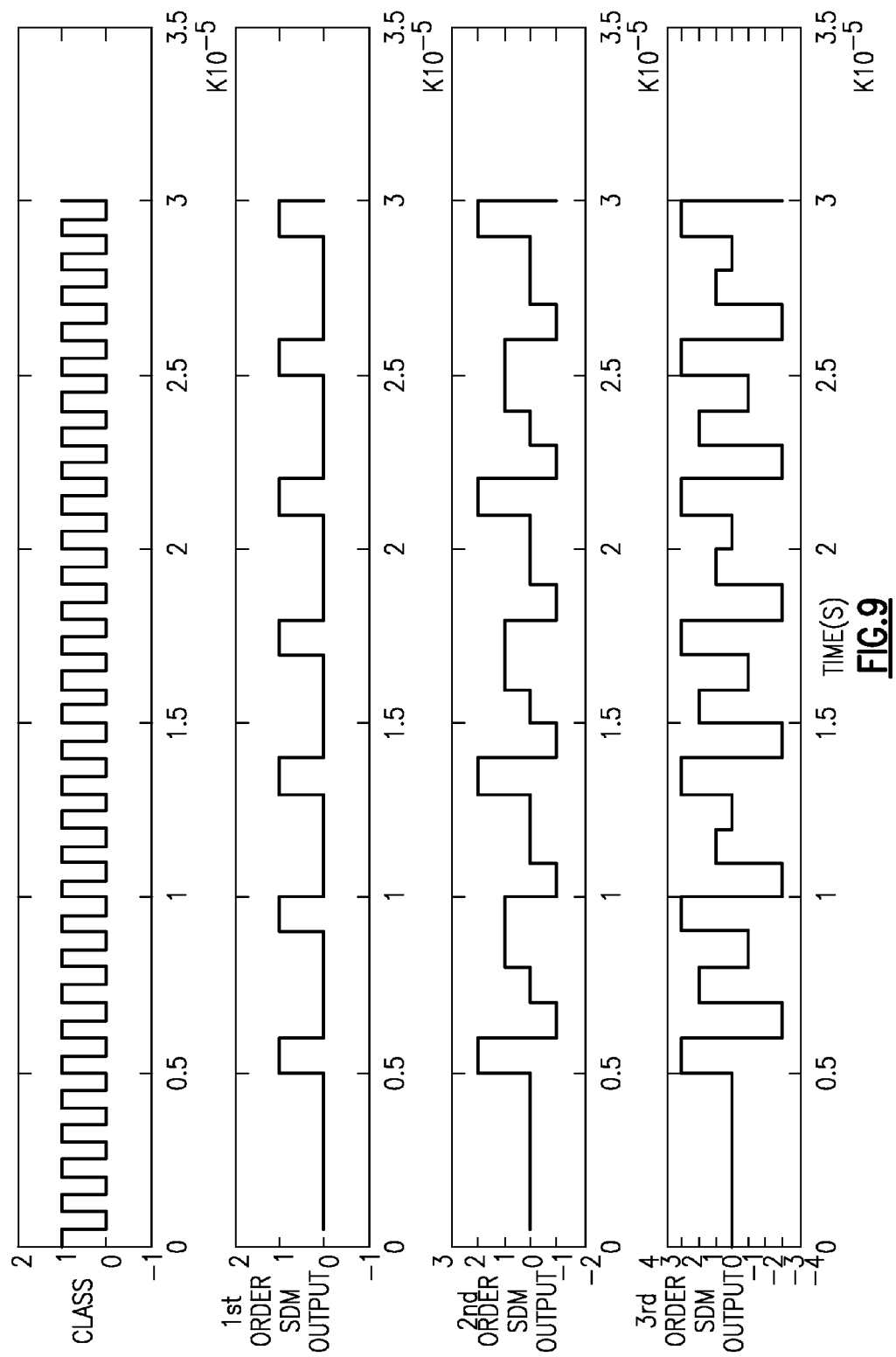
FIG. 9 shows an example operating configuration of a sigma delta modulator (SDM) that can be implemented in the PLL of FIG. 4 to allow the PLL to operate as a Frac-N.

As described herein, an SDM (200 in FIG. 4) can be incorporated into a PLL to allow the PLL to operate as a Frac-N PLL. FIG. 9 shows an example of how an SDM can be configured to provide different SDM orders.

As described herein, an SDM can allow the PLL to output a signal that represents a fractional portion of the divide value. FIG. 9 shows that different orders can be implemented for SDMs to yield such a fractional-divided output. The examples shown in FIG. 9 are in the context of an example divide value fraction of ¼; however, it will be understood that divisions by other fractions can also be implemented. It will also be understood that, for a given order, other SDM architectures can be implemented.

In FIG. 9, a clock trace is shown at the top. A 1st order SDM output is depicted as having a high for one clock cycle and low for the next three. Such a pattern can repeat. The length of this pattern in terms of clock cycle is commonly referred to as an SDM sequence length. In the foregoing 1st order SDM example, the SDM sequence length is 4.

In some embodiments, 2nd and 3rd order SDM configurations can have a more complicated patterns. However, in the context of the ¼ fraction example, such 2nd and 3rd order configurations still average out to ¼ over their respective sequence lengths. It is also noted that the sequence length may or may not increase as the order of the SDM increases.

As described herein by way of examples, various features associated with the feedback mechanism can allow the output frequency of the PLL to lock on to a desired frequency that is a non-integer multiple of the reference signal. As also described herein, such a non-integer multiple functionality can be facilitate by an integer dithering technique.

In some situations, such an integer dithering operation in a PLL can yield a side-effect that includes spurious tones, or spurs. A spur is typically considered to be an unwanted tone in the frequency domain at a particular frequency.

Spurs can be large and can appear as distinct spikes that rise above a noise floor. In some situations, spurs can be reference spurs that typically appear in the frequency domain at or near multiples of the reference frequency. Such spurs can occur in either Integer-N or Frac-N PLLs. Frac-N spurs typically can result from an SDM switching the integer divider value of the PLL.

In some situations, reference spurs can arise from the following operating conditions. In an ideal Integer-N PLL that has settled, the charge pump will output zero current as the loop filter holds the selected voltage for the VCO to thereby output the desired frequency. Charge pump mismatch can occur when rising edges of the feedback and reference signal occur simultaneously. For example, the PFD can output both UP and DOWN pulses until the PFD can reset itself. If the UP and DOWN pulse are mismatched, there can be an unwanted charge put on the loop filter that needs to be compensated for. Such compensation can occur periodically with the reference frequency, and can be a significant cause of reference spurs in an Integer-N PLL.

In some implementations, a Frac-N PLL is not truly settled because of the dithering provided by the SDM. Accordingly, current from the charge pump also will not settle to zero, although it can average to approximately zero. Instead, the charge pump pulse can exhibit violent changes in response to the SDM. Charge pump mismatch can also be an issue. However, as described herein, reference spurs can still be produced from an ideal charge pump with no mismatch.

In some implementations, a charge pump pulse can be utilized to generate nulls in the PLL output signal. To facilitate such a technique, one can consider how frequency components in the charge pump current can appear at the output of the PLL. Frequency components can first be attenuated by the loop filter. No mixing occurs at this point, so frequency nulls in the charge pump can still exist in the voltage signal at the VCO input. Even with the assumption that the VCO is linear, there still can exist a possibility for mixing of frequency components due to wideband FM modulation. If the modulation index of each frequency component at the VCO input is small enough, only narrowband FM modulation will occur. Since narrowband FM is generally linear, no new frequency components will be generated. Therefore frequency components that were nulled in the charge pump signal will still be nulled at the PLL output. Using such reasoning, one can implement a technique for reducing or eliminating particular frequencies in the charge pump current, and therefore the PLL output.

Figure 10:
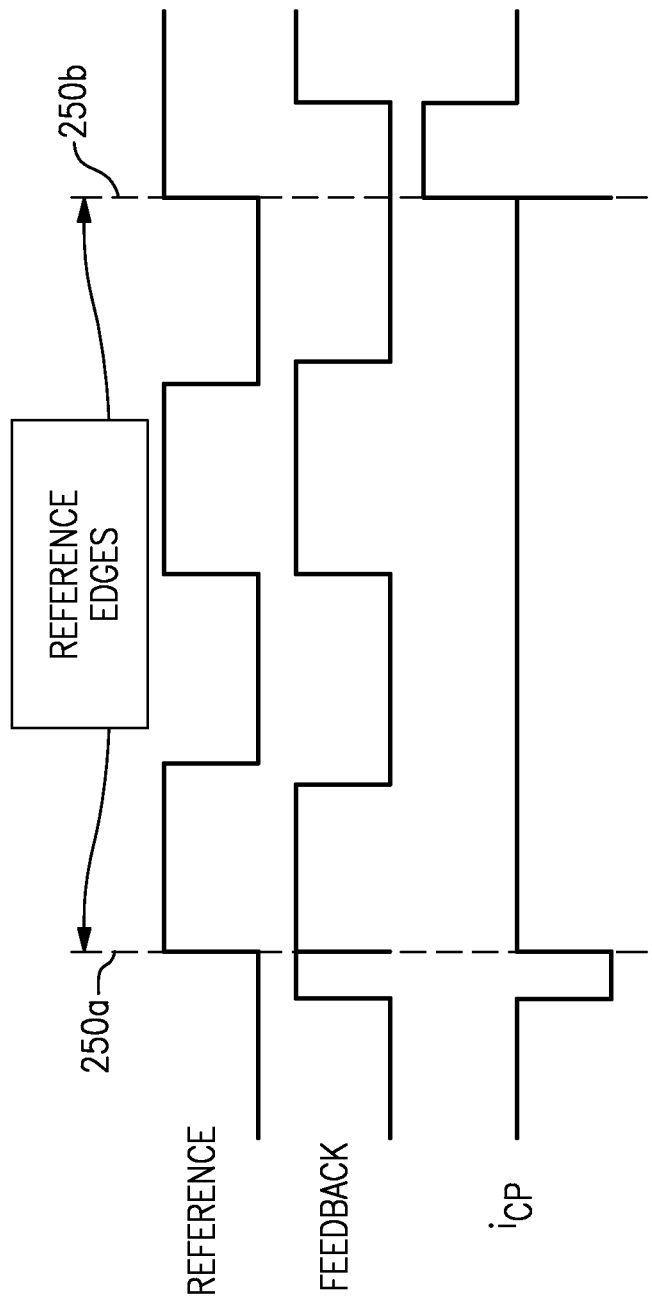
FIG. 10 shows an example charge pump current that can be implemented in the PLL FIG. 4.

FIG. 10 shows an example charge pump current ($i_{CP}$) found in a Frac-N PLL, such as the example described in reference to FIG. 4. Examples of reference and feedback signals, as well as example reference edge markers 250a, 250b are shown relative to the charge pump current trace.

In some implementations, the charge pump current pulse can be affected in two ways by the reference and feedback signals. First, the width of the charge pump pulse can dependent upon the spacing between the rising edges of the two signals. This is sometimes called pulse width modulation. Second, the charge pump pulse may occur either before or after the reference rising edge, depending on whether the reference signal leads or lags the feedback signal. This is sometimes called pulse position modulation. In some situations, these two factors can cause the charge pump to generate reference spurs. As described herein, other conditions such as charge pump mismatch can exacerbate reference spurs.

Figure 11:
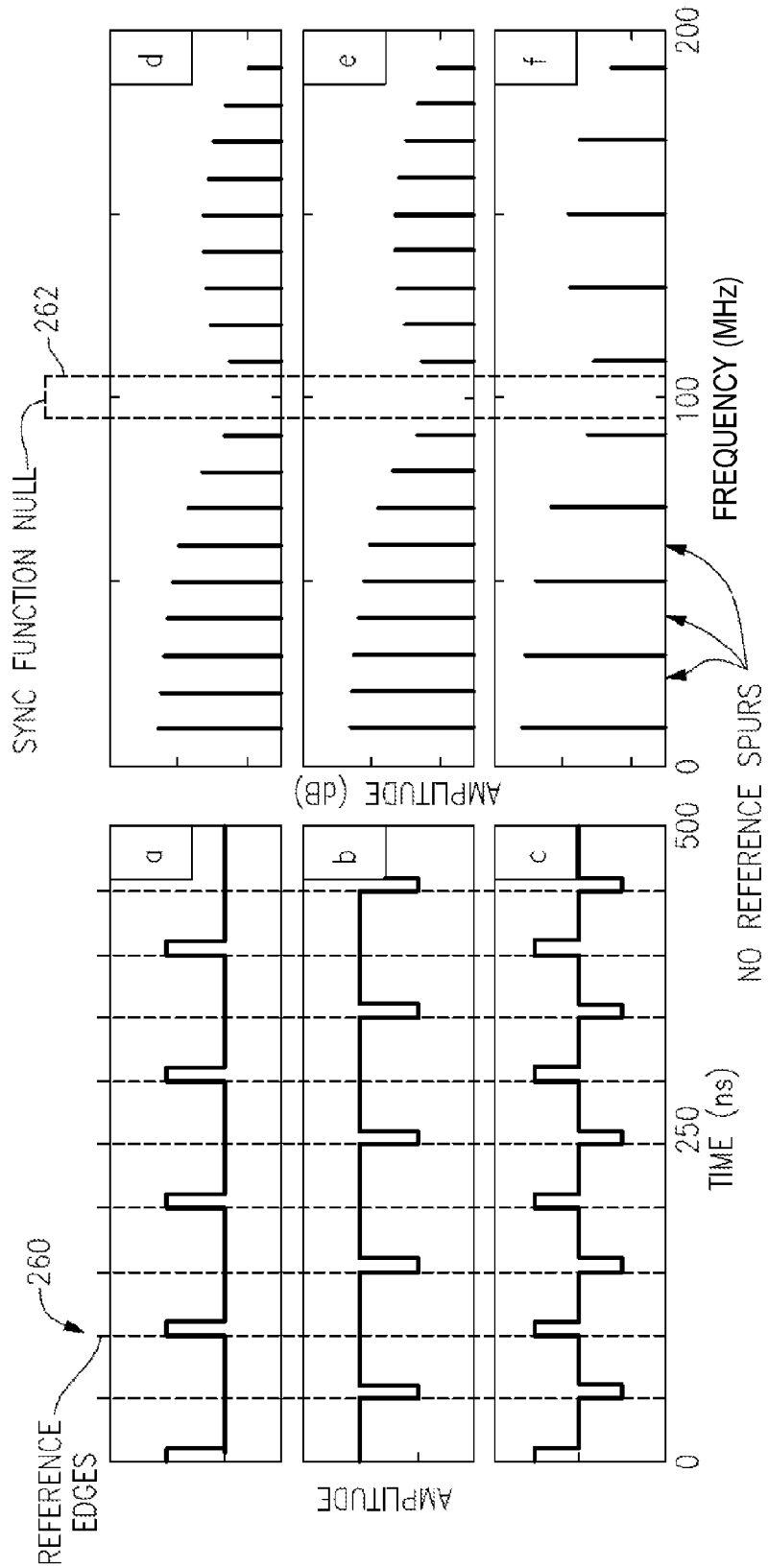
FIG. 11 shows an example result of simulation to demonstrate one or more effects of a charge pump pulse on reference spurs.
Figure 12:
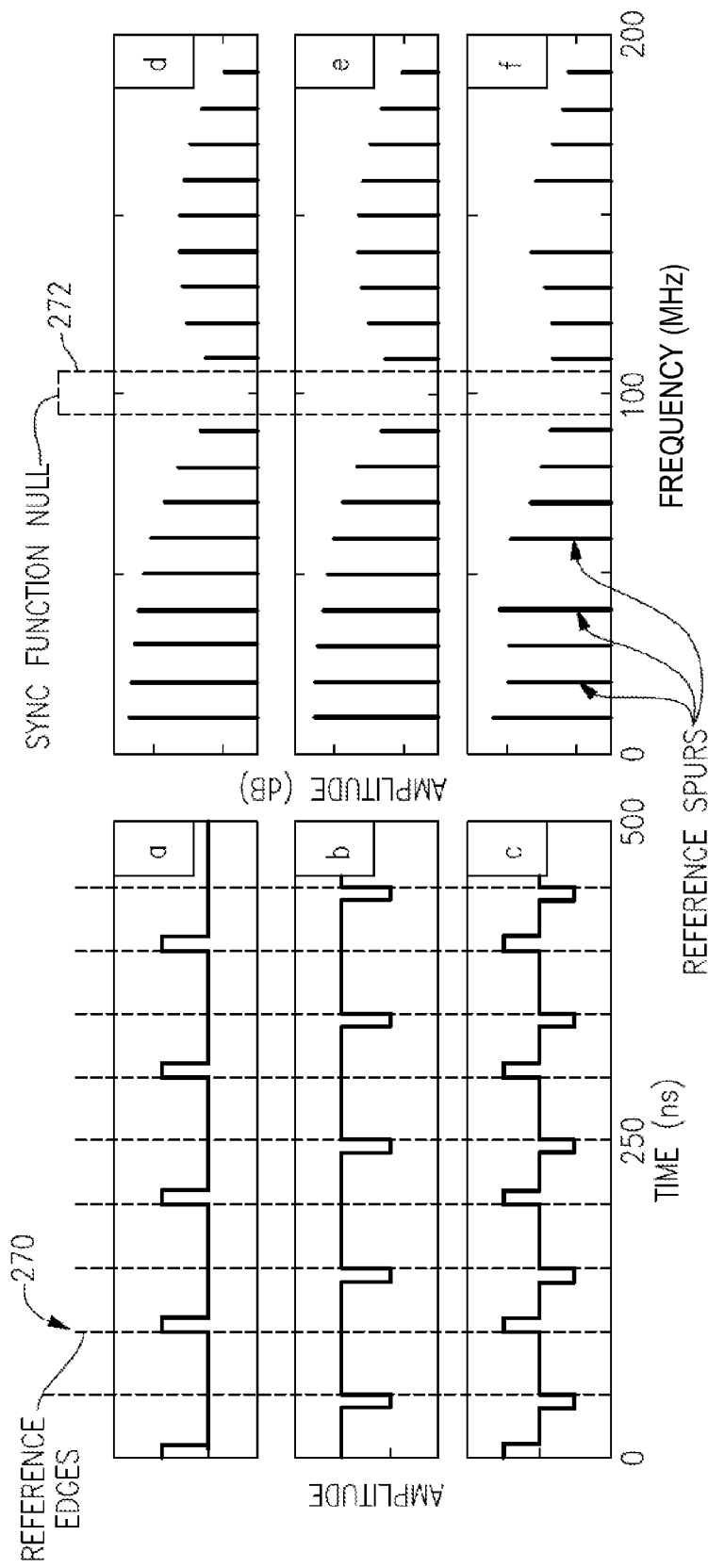
FIG. 12 shows another example result of simulation to demonstrate one or more effects of a charge pump pulse on reference spurs.
Figure 13:
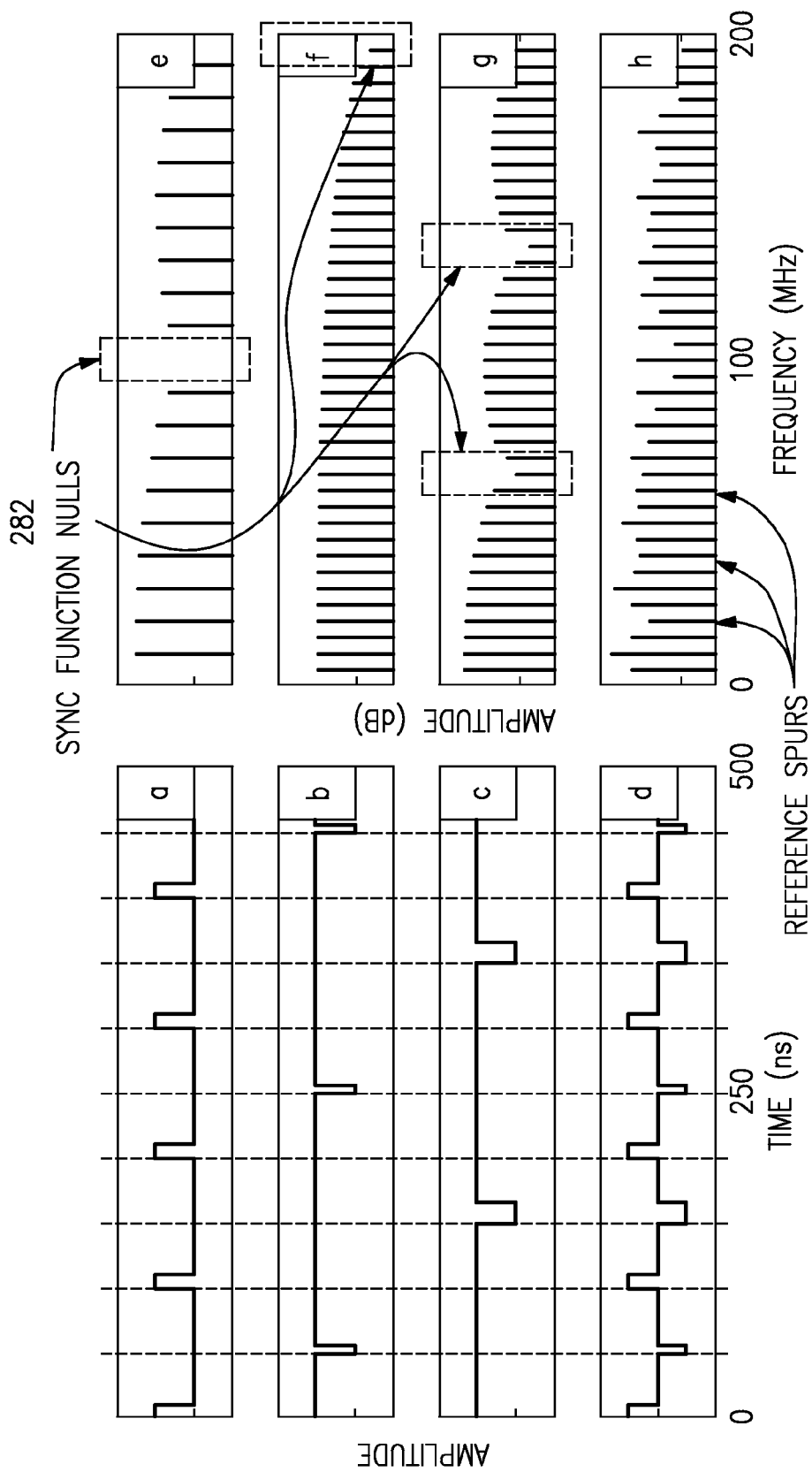
FIG. 13 shows yet another example result of simulation to demonstrate one or more effects of a charge pump pulse on reference spurs.

FIGS. 11-13 show example results of various simulations to demonstrate one or more effects of the charge pump pulse in terms of reference spurs. In FIG. 11, a simple pulse train that has neither pulse width nor pulse position modulation is shown. Pulse trains corresponding to panels (a) to (c) are time domain signals; and their corresponding frequency domain signals are shown in panels (d) to (f).

The time domain rectangular pulses of panels (a) and (b) are represented by sync functions in the frequency domain (panels (d) and (e)). For the purpose of description herein, "sync" function can be used interchangeably with "sinc" function to refer to ($\sin(x)/x$). In the example of FIG. 11, both of these two pulses have a frequency of 10 MHz. Such a frequency determines the spacing of the spurs as shown in panels (d) and (e). The example pulses have a 10% duty cycle. This leads to the first sync function null 262 occurring at 100 MHz. In some implementations, it is possible to change the location of this null by changing the pulse width. For example, larger pulse widths can move the null to lower frequencies. One or more features associated with this technique can be utilized to reduce or eradicate any frequency components after the first reference frequency by setting the pulse width.

The signal train of panel (c) corresponds to a sum of the signal trains of panels (a) and (b). The rising edges (260) of the pulses now occur at 20 MHz, which is analogous to the reference frequency in a PLL. It is noted is that there is no frequency components at integer multiples of 20 MHz. Such a feature is described herein in greater detail.

In FIG. 12, a phase shift is introduced in the signal train of panel (b). Introduction of such a phase shift can simulate pulse position modulation. Frequency domain representations of panels (d) and (e) are similar to those of panels 11(d) and 11(e), since phase information is not shown in the frequency domain results. However, when the signal traces of panels (a) and (b) are summed together, panel (f) shows that there are no longer nulls at multiples of the reference frequency. That is, reference spurs are generated at frequencies where nulls are in the example of FIG. 11. This example demonstrates that pulse position modulation can contribute to reference spurs.

In FIG. 13, up pulses of the signal train of panel (d) is similar to that of panel (c) of FIG. 11. Down pulses of the signal train of panel (d), however, have pulse width modulation applied to them. The entire signal of panel (d) still averages out to zero. As with the pulse position modulation example of FIG. 12, pulse width modulation generates reference spurs.

With the examples of FIGS. 11-13, it is shown that both pulse position modulation and pulse width modulation can contribute to reference spurs. To reduce or eradicate reference spurs then, a pulse train having the characteristics of the pulse in panel (c) of FIG. 11 can be utilized. More specifically, a pulse train from the charge pump can be configured to have substantially constant width pulses that begin substantially at the rising edges of the reference signal.

FIG. 13 provides an explanation of how Frac-N spur spacing can be related to a sequence length of a pulse train. The pulse train of panel (d) has a sequence length of 4. That is, the signal repeats every 4 pulses. Based on superposition principle, the signal of panel (d) can be broken down into the signals of panels (a) to (c). The signal of panel (a) has a period of 100 ns, thereby yielding frequency components with a spacing of 10 MHz. The signals of panels (b) and (c) have a period of 200 ns, thereby yielding frequency components with a spacing of 5 MHz.

Based on the foregoing, Frac-N spur location and how it relates to the reference frequency can be expressed as $$n_{th} \text{ spur location} = n f_{ref}/L_s \tag{1}$$

where $L_s$ is the sequence length of the pulse train. From this equation, it can be seen that there are $L_s - 1$ spurs between each reference frequency. Additionally, every $L_s^{th}$ spur is a reference frequency.

In some implementations, reference spurs can be reduced or eliminated from a charge pump pulse by elimination of pulse position modulation and/or pulse width modulation. By way of an example, such elimination can be achieved by generating a fixed-width variable-amplitude (FWVA) pulse. In some PLLs, pulse position modulation and pulse width modulation can be responsible for representing phase error information. With a FWVA pulse, phase error information can be stored in or be represented by the amplitude of the pulse.

Figure 14:
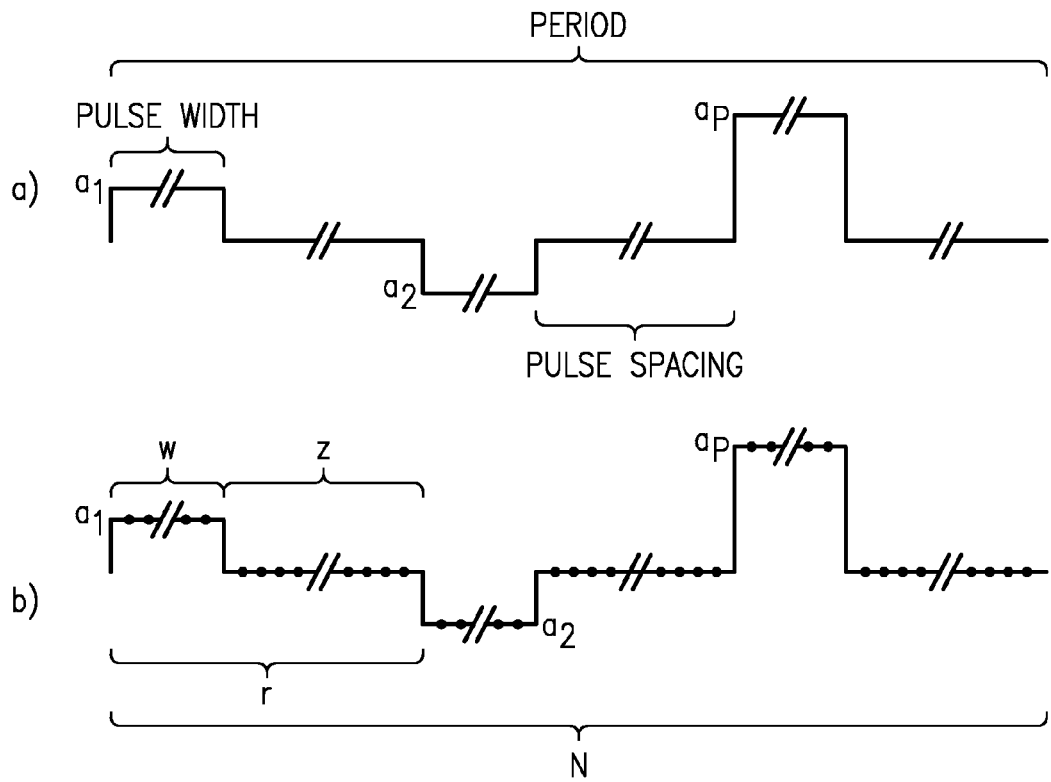
FIG. 14 shows an example of a fixed-width variable-amplitude (FWVA) pulse that can be implemented to facilitate removal of reference spurs.

An example FWVA pulse train is shown in FIG. 14. In some implementations, following restrictions can be placed on the signal. For example, the width of each pulse ("Pulse width" in panel (a)) can be substantially equal. In another example, the spacing between pulses ("Pulse spacing" in panel (a)) can also be substantially equal. In yet another example, the amplitude of each pulse can be set to be arbitrary to solve a general case, and can be defined as $a_1, a_2, \ldots, a_p$. In yet another example, the signal can be made to be substantially periodic.

Discrete Fourier analysis can be utilized to examine the frequency spectrum of the example signal of FIG. 14. Such an analysis can show a substantially total cancellation of the frequency components at frequencies related to the beginning edges of each pulse. These frequencies are analogous to integer multiples of the reference frequency in a PLL.

In the example of FIG. 14, the signal depicted in panel (a) is continuous in the time domain. Such a signal can be sampled for use in a discrete-time Fourier analysis. Panel (b) of FIG. 14 shows the signal after it has been sampled.

Based on the sampling of panel (b), one can define a discrete signal $x(n)$ as $$x(n) = \{a_1 a_1 \ldots a_1 00 \ldots 00 a_2 a_2 \ldots a_2 00 \ldots 00 a_p \; a_p \ldots a_p 00 \ldots 00\}. \tag{2}$$

Using a discrete Fourier equation, one can generate the spur amplitudes of the reference frequencies. Consider the following example analysis equation for discrete-time periodic signals:

$$c_k = \frac{1}{N} \sum_{n=0}^{N-1} x(n) e^{-(j2\pi kn)/N} \tag{3}$$

where k is the index of the frequency component. Other parameters or variables associated with FIG. 14 and Equation 3 are listed in Table 1.

TABLE 1

| Parameter/Variable | Represents |
| --- | --- |
| x(n) | Time domain signal |
| p | Total number of pulses per period N |
| n | Index of the signal x(n) |
| w | Number of samples per pulse |
| z | Number of zeros between pulses |
| r | Reference period: w + z |
| N | Period of signal: p(w + z) |

By substituting $x(n)$ of Equation 2 into Equation 3, $c_k$ can be expressed as $$c_k = \frac{1}{N} \begin{bmatrix} a_1\left(1 + e^{-\frac{j2\pi k}{N}} + e^{-\frac{j2\pi k 2}{N}} + \ldots + e^{-\frac{j2\pi k(w-1)}{N}}\right) + \\ a_2\left(e^{-\frac{j2\pi k(r)}{N}} + e^{-\frac{j2\pi k(r+1)}{N}} + \ldots + e^{-\frac{j2\pi k(r+w-1)}{N}}\right) + \\ a_3\left(e^{-\frac{j2\pi k(2r)}{N}} + e^{-\frac{j2\pi k(2r+1)}{N}} + \ldots + e^{-\frac{j2\pi k(2r+w-1)}{N}}\right) + \ldots + \\ a_p\left(e^{-\frac{j2\pi k((p-1)r)}{N}} + e^{-\frac{j2\pi k((p-1)r+1)}{N}} + \ldots + e^{-\frac{j2\pi k((p-1)r+w-1)}{N}}\right) \end{bmatrix} \tag{4}$$

From Equation 1, the number of spurs between each reference frequency is equal to the sequence length, or p in this analysis. Accordingly, the first reference spur occurs at $c_p$. Solving for $c_p$ (using N=pr from Table 1 where appropriate), one can obtain $$c_p = \frac{1}{N} \begin{bmatrix} a_1\left(1 + e^{-\frac{j2\pi}{r}} + e^{-\frac{j2\pi 2}{r}} + \ldots + e^{-\frac{j2\pi(w-1)}{r}}\right) + \\ a_2\left(e^{-\frac{j2\pi(r)}{r}} + e^{-\frac{j2\pi(r+1)}{r}} + \ldots + e^{-\frac{j2\pi(r+w-1)}{r}}\right) + \\ a_3\left(e^{-\frac{j2\pi(2r)}{r}} + e^{-\frac{j2\pi(2r+1)}{r}} + \ldots + e^{-\frac{j2\pi(2r+w-1)}{r}}\right) + \ldots + \\ a_p\left(e^{-\frac{j2\pi((p-1)r)}{r}} + e^{-\frac{j2\pi((p-1)r+1)}{r}} + \ldots + e^{-\frac{j2\pi((p-1)r+w-1)}{r}}\right) \end{bmatrix} \tag{5}$$

One can express everything inside the round brackets as X. Then, $c_p$ can be expressed as $$c_p = \frac{1}{N}[a_1 X + a_2 X + a_3 X + \ldots + a_p X] \tag{6}$$
$$= \frac{X}{N}[a_1 + a_2 + a_3 + \ldots + a_p]$$

The foregoing simplification that yields Equation 6 can be performed as follows. In Equation 4, one can equate the first terms in the curved brackets, so that $$1 = e^{-\frac{j2\pi(r)}{r}} = e^{-\frac{j2\pi(2r)}{r}} = e^{-\frac{j2\pi((p-1)r)}{r}} \tag{7}$$

Similarly, one can equate the second terms in the curved brackets of Equation 4 to yield $$e^{-\frac{j2\pi}{r}} = e^{-\frac{j2\pi(r+1)}{r}} = e^{-\frac{j2\pi(2r+1)}{r}} = e^{-\frac{j2\pi((p-1)r+1)}{r}} \tag{8}$$

Such equating process can be done for all of the terms in the curved brackets.

From Equation 6, one can see that as long as the pulse train amplitudes $a_1$ through $a_p$ all sum to zero there is no reference spur. Similar strategy can be used to determine the spur amplitude for integer multiples of the $p^{th}$ spur (e.g., for any multiple of the reference frequency).

To demonstrate that Equation 6, is valid or at least sufficient to provide spur reduction or eradication functionality, MATLAB was used to generate an arbitrary signal representative of the example of panel (b) in FIG. 14. Such a generated signal is shown in FIG. 15, where the pulse frequency is at 10 MHz and the pulse widths are 10%.

Figure 15:
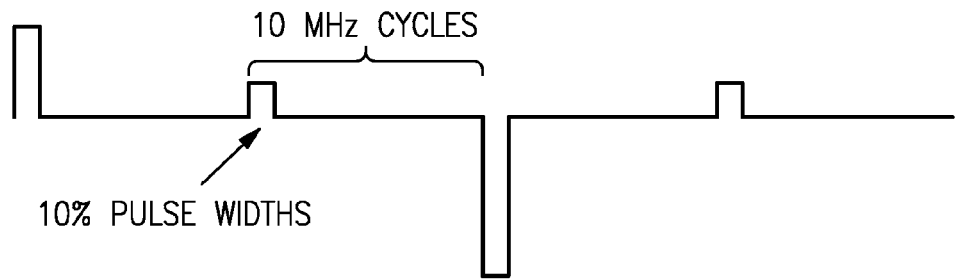
FIG. 15 shows another example of an FWVA pulse signal.
Figure 16:
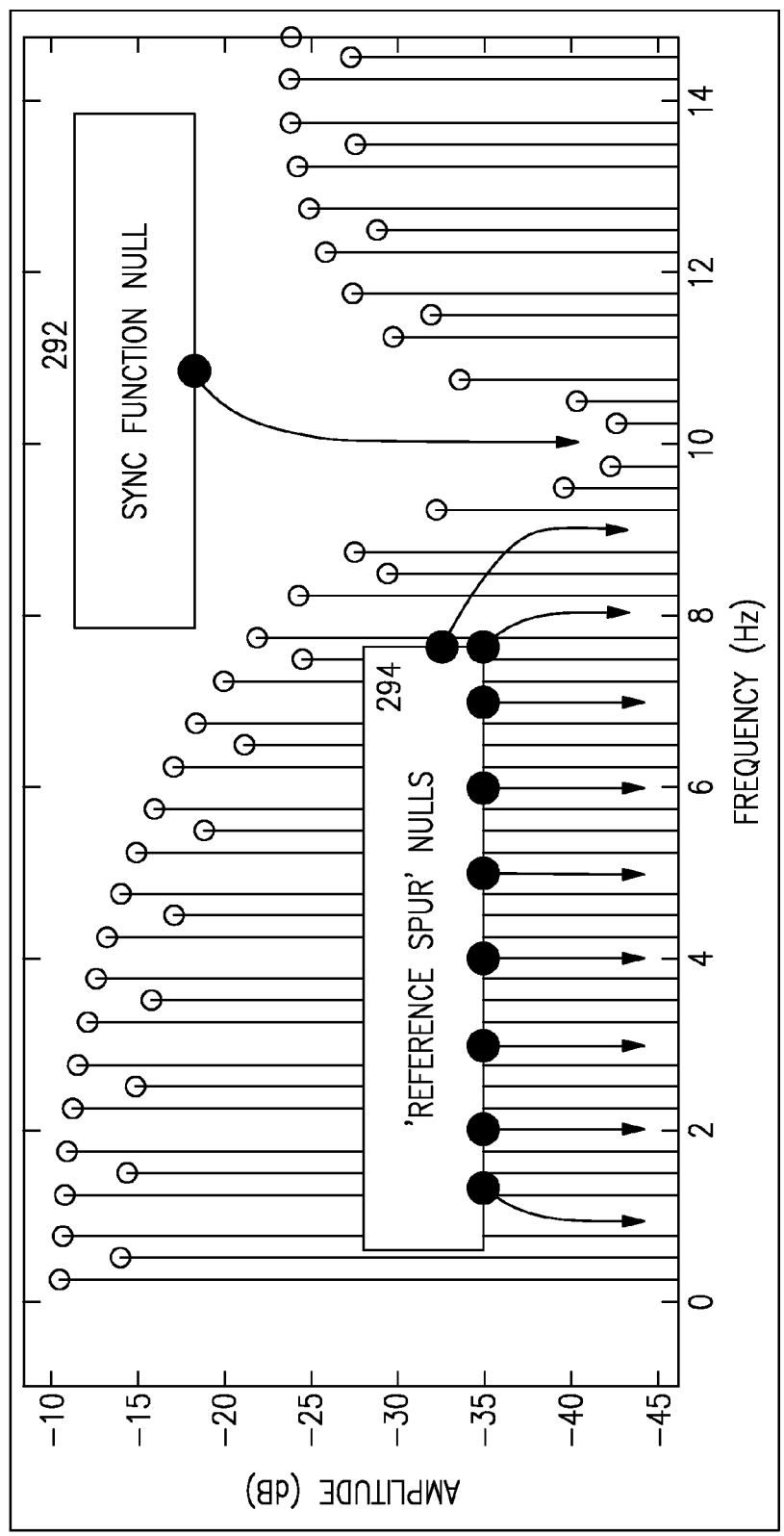
FIG. 16 shows a frequency domain representation of the time domain signal of FIG. 15.

FIG. 16 shows the frequency domain representation of the time domain signal of FIG. 15. It is noted that the nulls (294) occur every 10 MHz as predicted by Equation 6. It is also noted that the sync function shape has a null (292) at 100 MHz. Having an example 10% pulse width yields the first sync null at 10 times the reference. Having an example pulse width of 100% would put the sync pulse null on top of the first reference pulse null. This implies that in some situations, the first reference frequency is the furthest the sync pulse null can be pulled in.

The foregoing example demonstrates two methods in which reference spurs can be eliminated. First, nulls can occur at integer multiples of the reference frequency. Second, nulls can be arbitrarily placed at any frequency greater than the reference frequency by changing the pulse width.

Figure 17:
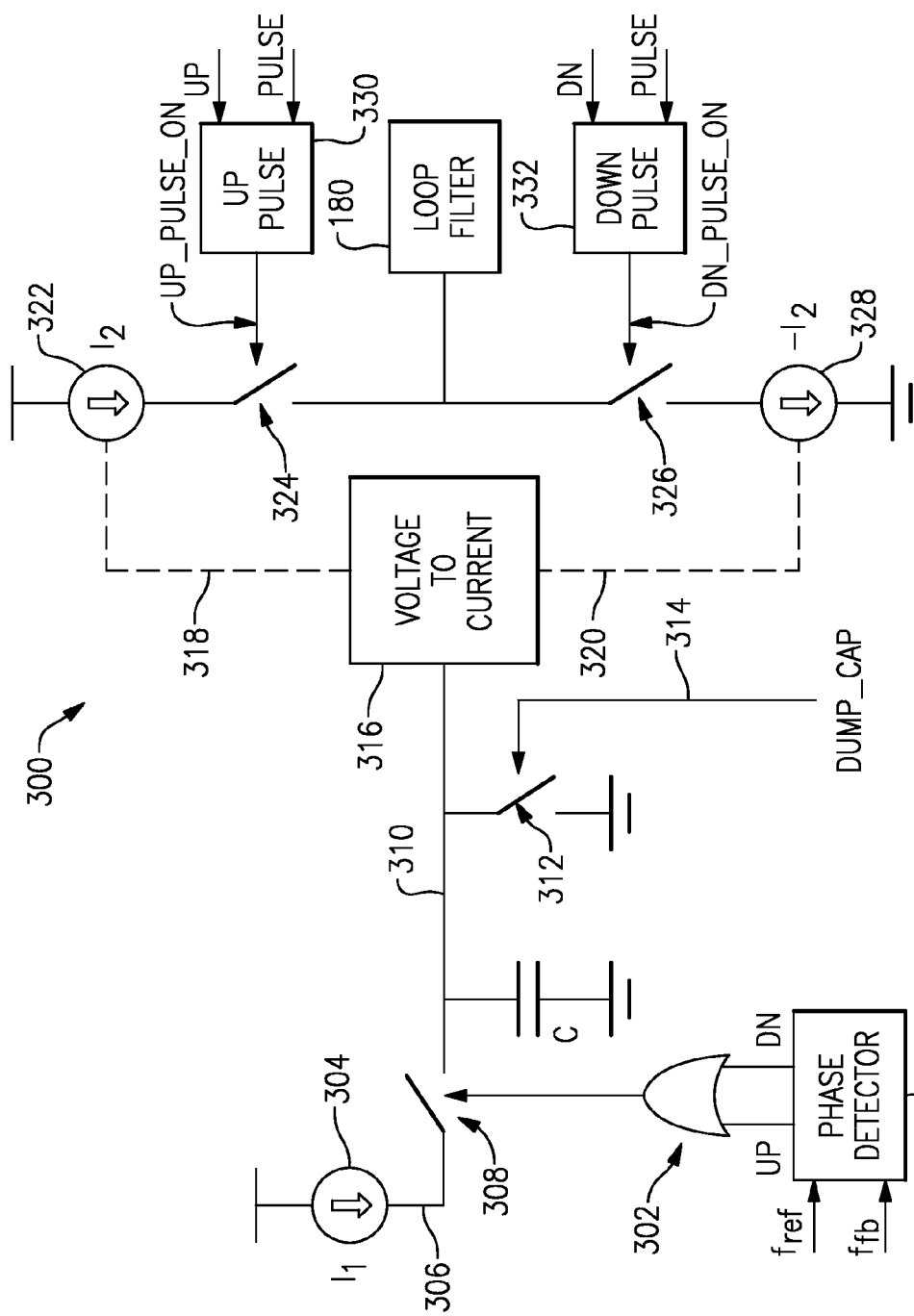
FIG. 17 shows an example configuration of a fixed width variable amplitude charge pump (FWVACP).
Figure 18:
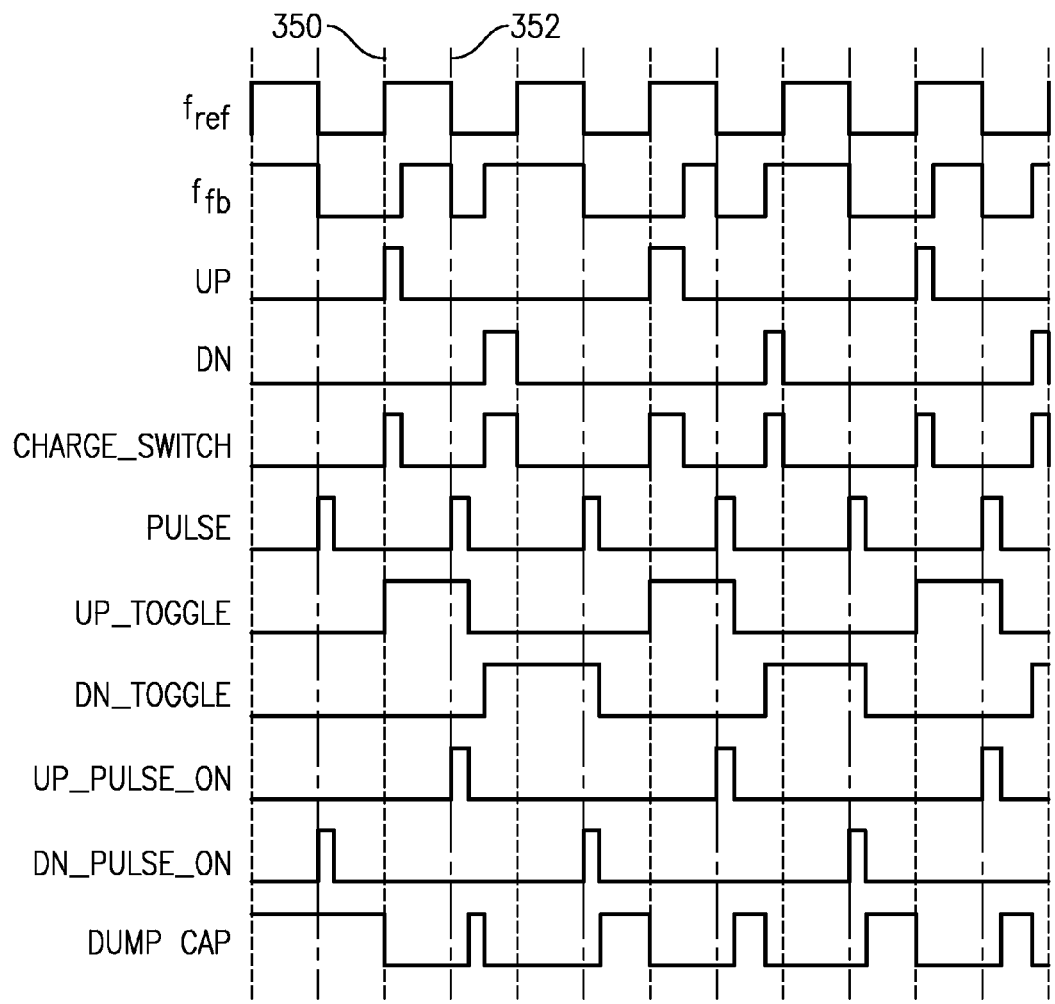
FIG. 18 shows timing diagrams for various parameters associated with the FWVACP configuration of FIG. 17.

FIG. 17 shows an example configuration 300 that can be implemented to provide one or more functionalities as described herein. The example configuration 300 is described as a fixed width variable amplitude charge pump (FWVACP). FIG. 18 shows timing diagrams for various parameters associated with the FWVACP configuration of FIG. 17.

A phase detector 172 is shown to have as inputs reference signal (frequency $f_{ref}$) and feedback signal (frequency $f_{fb}$) in a PLL. For the purpose of description, these signals can also be referred to by their respective frequencies—for example, $f_{ref}$ for the reference clock signal, and $f_{fb}$ for the feedback signal.

In the phase detector 172, $f_{ref}$ is compared with $f_{fb}$. Based on the comparison, the phase detector 172 can generate an 'up' or 'down' pulse that relates to the phase error for a given cycle of $f_{ref}$. Such comparison of the input signals and generation of the 'up' or 'down' pulse can be achieved by, for example, a tristate phase detector configuration.

The 'up' and 'down' pulses can be OR'ed (302) together to generate a 'charge_switch' signal which is provided to and engage a charging switch 308. With the charging switch 308 engaged, current $I_1$ (from a current source 304 and through path 306) can charge a capacitor C. The charge on the capacitor C does not know if it resulted from an 'up' or 'down' pulse. Such information can be recorded in the signals from the 'Up Pulse' and 'Down Pulse' blocks, described below in greater detail.

The charge on the capacitor C represents the accumulated phase error for a single reference clock cycle as defined by clock signal $f_{ref}$. A 'Voltage to Current' circuit can be configured to receive (through path 310) and convert the voltage over C into a current $I_2$ generated by a current source 322 or 328 (through their respective control paths 318 and 320). With the current $I_2$ now set, a set of switches can be provided and configured to pass the current on to a loop filter 180. For example, an 'Up Pulse Switch' 324 under the control of an 'Up Pulse' block 330 (with switching signal 'up_pulse_on') can allow positive $I_2$ to be provided from the current source 322 to the loop filter 180. Similarly, a 'Down Pulse Switch' 326 under the control of a 'Down Pulse' block 332 (with switching signal 'dn_pulse_on') can allow negative $I_2$ to be provided from the current source 328 to the loop filter 180.

It is noted that an output signal that is generated by the FWVACP preferably has a fixed width. In some implementations, such an output can be facilitated by configuring the 'Up Pulse' block 330 and the 'Down Pulse' block 332 so that their respective output signals 'up_pulse_on' and 'dn_pulse_on' include pulses that have a substantially constant width.

In some implementations, such a constant width of the 'up_pulse_on' and 'dn_pulse_on' signals can be controlled by a 'pulse' signal shown to be input into each of the 'Up Pulse' block 330 and the 'Down Pulse' block 332. For example, and as shown in the timing diagrams of FIG. 18, the 'pulse' signal can begin on the falling edge (352) of $f_{ref}$ in order to capture phase error information from both 'up' and 'down' pulses.

Based on the foregoing 'pulse' signal as an input, the 'Up Pulse' block 330 can be configured to operate as follows. Signals 'up' and 'pulse' are fed into the block (330). The 'up' signal can be obtained from the output of the phase detector 172 as described herein. A signal generated within the 'Up Pulse' block 330 and referred to herein as 'up_toggle' can be configured to go high when an 'up' rising edge (350 in FIG. 18) is emitted from the phase detector 172, and go low at the falling edge (e.g., the first falling edge) of the 'pulse' signal. The 'up_toggle' signal and the 'pulse' signal can be combined (e.g., an AND operation) to generate the 'up_pulse_on' signal. As described herein, the 'up_pulse_on' can be provided to and engage the 'Up Pulse Switch' 324.

Similarly, the 'Down Pulse' block 332 can be configured to operate based on the 'pulse' signal as an input. Signals 'dn' and 'pulse' are fed into the block (332). The 'dn' signal can be obtained from the output of the phase detector 172 as described herein. A signal generated within the 'Down Pulse' block 332 and referred to herein as 'dn_toggle' can be configured to go high when a 'dn' rising edge is emitted from the phase detector 172, and go low at the falling edge (e.g., the first falling edge) of the 'pulse' signal. The 'dn_toggle' signal and the 'pulse' signal can be combined (e.g., an AND operation) to generate the 'dn_pulse_on' signal. As described herein, the 'dn_pulse_on' can be provided to and engage the 'Down Pulse Switch' 326.

As shown in FIG. 17, with either the 'Up Pulse Switch' 324 or the 'Down Pulse Switch' 326 engaged, a respective current is passed on to the loop filter 180. As further shown in FIGS. 17 and 18, a 'dump_cap' signal can be provided (through path 314) to a 'Drain Cap Switch' 312 to allow draining of the charge on C at an appropriate time by engaging the 'Drain Cap Switch' 312.

In the foregoing example of the FWVACP operation, timing of the various signals can be important. For example, it is preferable to have the 'Up Pulse Switch' 324 or the 'Down Pulse Switch' 326 be engaged when the capacitor C has substantially fully stored the charge for a given reference cycle. In some implementations, the 'Up Pulse Switch' 324 or the 'Down Pulse Switch' 326 is only engaged when the capacitor C has fully stored the charge for a given reference cycle.

Said another way, it is preferable that if either of the 'Up Pulse Switch' 324 or the 'Down Pulse Switch' 326 is engaged, the 'Charging Switch' 308 not be engaged. In some implementations, if either of the 'Up Pulse Switch' 324 or the 'Down Pulse Switch' 326 is engaged, the 'Charging Switch' 308 is not engaged.

It is preferable to have the capacitor C be substantially fully drained before the 'Charging Switch' 308 is engaged. In some implementations, the capacitor C is fully drained before the 'Charging Switch' 308 is engaged.

It is preferable that the capacitor C not be draining if an output pulse is being provided to the loop filter 180. In some implementations, the capacitor C is not draining if an output pulse is being provided to the loop filter 180.

Figure 19:
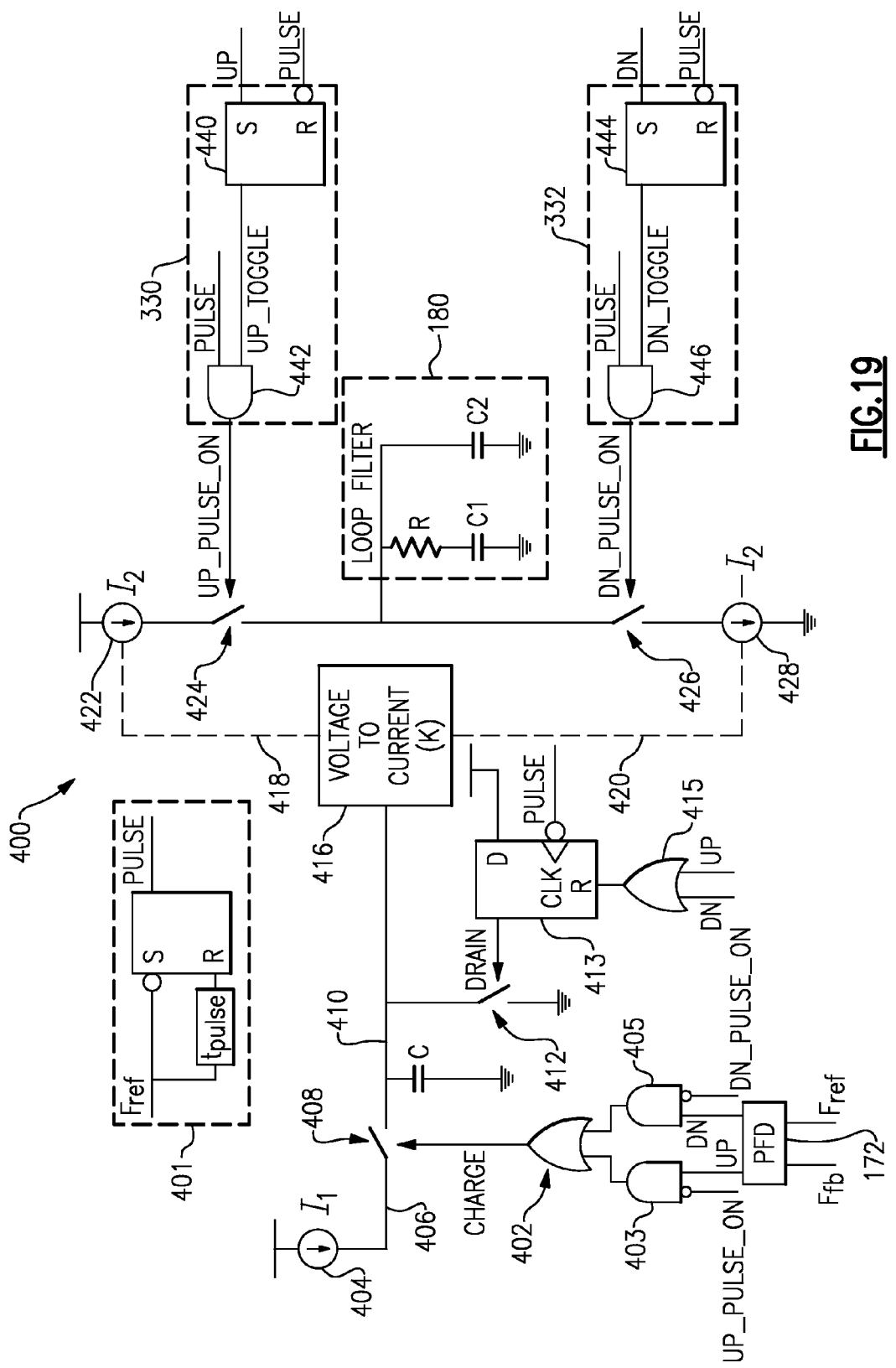
FIG. 19 shows another example configuration of a fixed width variable amplitude charge pump (FWVACP).
Figure 20:
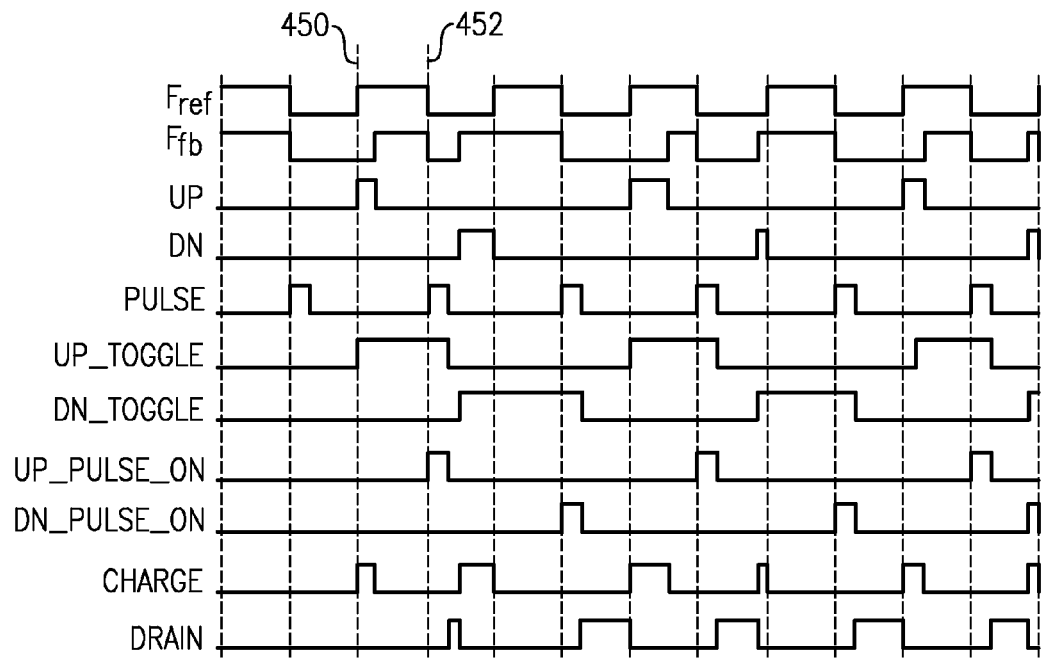
FIG. 20 shows timing diagrams for various parameters associated with the FWVACP configuration of FIG. 19.

FIG. 19 shows an example configuration 400 that can be implemented to provide one or more functionalities as described herein. The example configuration 400 is described as a fixed width variable amplitude charge pump (FWVACP). FIG. 20 shows examples of timing diagrams for various parameters associated with the FWVACP configuration of FIG. 19.

A phase detector 172 is shown to have as inputs reference signal (frequency $F_{ref}$) and feedback signal (frequency $F_{fb}$) in a PLL. For the purpose of description, these signals can also be referred to by their respective frequencies—for example, $F_{ref}$ for the reference clock signal, and $F_{fb}$ for the feedback signal.

In the phase detector 172, $F_{ref}$ can be compared with $F_{fb}$. Based on the comparison, the phase detector 172 can generate an UP or DN signal that relates to the phase error for a given cycle of $F_{ref}$. Such comparison of the input signals and generation of the UP or DN signal can be achieved by, for example, a tristate phase detector configuration.

The UP signal and an inverse of an UP_PULSE_ON signal can be AND'ed (403). Similarly, the DN signal and an inverse of a DN_PULSE_ON signal can be AND'ed (405). Examples of how the UP_PULSE_ON signal and the DN_PULSE_ON signal can be generated are described herein in greater detail.

The output of the AND gate 403 and the output of the AND gate 405 can be OR'ed (402) together to generate a CHARGE signal which is provided to and engage a charging switch 408. With the charging switch 408 engaged, current $I_1$ (from a current source 404 and through path 406) can charge a capacitor C. The charge on the capacitor C does not know if it resulted from an UP or DN pulse. Such information can be recorded in the signals from UP PULSE and DN PULSE blocks 330, 332, described below in greater detail.

The charge on the capacitor C represents the accumulated phase error for a single reference clock cycle as defined by clock signal $F_{ref}$. For example, the charge accumulated on C can be proportional to the magnitude of the phase difference between $F_{ref}$ and $F_{fb}$. A 'Voltage to Current' circuit 416 can be configured to receive (through path 410) and convert the voltage on C into a current $I_2$ generated by a current source 422 or 428 (through their respective control paths 418 and 420). With the current $I_2$ now set, a set of switches can be provided and configured to pass the current on to a loop filter 180. For example, an UP_PULSE switch 424 under the control of an UP PULSE block 330 (with switching signal UP_PULSE_ON) can allow positive $I_2$ to be provided from the current source 422 to the loop filter 180. Similarly, a DN_PULSE switch 426 under the control of a DN PULSE block 332 (with switching signal DN_PULSE_ON) can allow negative $I_2$ to be provided from the current source 428 to the loop filter 180.

It is noted that an output signal that is generated by the FWVACP preferably has a fixed width. In some implementations, such an output can be facilitated by configuring the UP PULSE block 330 and the DN PULSE block 332 so that their respective output signals UP_PULSE_ON and DN_PULSE_ON include pulses that have a substantially constant width.

In some implementations, such a constant width of the UP_PULSE_ON and DN_PULSE_ON signals can be controlled by a PULSE signal shown to be input into each of the UP PULSE block 330 and the DN PULSE block 332. For example, and as shown in the timing diagrams of FIG. 20, the PULSE signal can begin on the falling edge (452 in FIG. 20) of $F_{ref}$ in order to capture phase error information from both UP and DN pulses. In FIG. 19, an inset indicated as 401 shows an example of how the foregoing PULSE signal can be generated from the falling edge of $F_{ref}$. A flip-flop operation between an inverse of $F_{ref}$ signal and a delayed (by $t_{pulse}$) version of the $F_{ref}$ signal is shown to yield the PULSE signal. Such an operation can result in the PULSE signal going high on the falling edge of $F_{ref}$ to close either the UP_PULSE switch (424 in FIG. 19) or the DN_PULSE switch (426) for a selected fixed time set by the delay element $t_{pulse}$. It is noted that the PULSE signal preferably has the same frequency as $F_{ref}$.

Based on the foregoing PULSE signal as an input, the UP PULSE block 330 can be configured to operate as follows to create the constant width UP_PULSE_ON signal. An UP_TOGGLE signal can be generated by a block 440, with UP_TOGGLE going high on the rising edge (450 in FIG. 20) of an UP signal, and going low on the falling edge (e.g., the first falling edge) of the PULSE signal. The UP signal can be obtained from the output of the phase detector 172 as described herein. Similarly, the DN PULSE block 332 can be configured to operate as follows to create the constant width DN_PULSE_ON signal. A DN_TOGGLE signal can be generated by a block 444, with DN_TOGGLE going high on the rising edge (450 in FIG. 20) of a DN signal, and going low on the falling edge (e.g., the first falling edge) of the PULSE signal. The DN signal can be obtained from the output of the phase detector 172 as described herein.

In the UP PULSE block 330, the UP_TOGGLE signal and the PULSE signal are shown to be AND'ed (442) to generate the UP_PULSE_ON signal. Similarly, in the DN PULSE block 332, the DN_TOGGLE signal and the PULSE signal are shown to be AND'ed (446) to generate the DN_PULSE_ON signal. As described herein, the UP_PULSE_ON and DN_PULSE_ON signals can close the UP_PULSE and DN_PULSE switches (424, 426), respectively. It is noted that each of the UP_PULSE_ON signal and the DN_PULSE_ON signal preferably has a fixed width substantially equal to the width of the PULSE signal.

As shown in FIG. 19, with either the UP_PULSE switch 424 or the DN_PULSE switch 426 engaged, a respective current is passed on to the loop filter 180. As shown in the example of FIG. 19, the loop filter 180 can include a parallel combination of two paths to a signal ground, with the first path including a resistance R and a capacitance C1, and the second path including a capacitance C2.

As further shown in FIGS. 19 and 20, a DRAIN signal can be provided to a DRAIN_CAP switch 412 to allow draining of the charge on C at an appropriate time by engaging the DRAIN_CAP switch 412. The DRAIN signal can be provided from flip-flop block 413 as follows. The DRAIN signal can go high on the falling edge of the PULSE signal and can be reset on the rising edge of either the UP or DN signals (OR'ed at 415). Such a configuration can result in DRAIN being low when either CHARGE or PULSE is high. Also, the charging capacitor C can be substantially fully drained before the charging switch 408 is closed. Resetting the DRAIN signal on the rising edge of UP or DN can ensure that the charging capacitor C is drained for at least half a cycle ($\theta_e = \pi$). For example, DRAIN can go high on the falling edge of PULSE and remain high until the rising edge of CHARGE. Such a configuration can also ensure that the values of C and $I_1$ have little or no effect on the loop dynamics when current is flowing on to or from the loop filter 180.

In the foregoing example of the FWVACP configuration of FIGS. 19 and 20, timing of the various signals can be important. For example, it is preferable to have the UP_PULSE switch 424 or the DN_PULSE switch 426 be engaged when the capacitor C has substantially fully stored the charge for a given reference cycle. In some implementations, the UP_PULSE switch 424 or the DN_PULSE switch 426 is only engaged when the capacitor C has fully stored the charge for a given reference cycle. Such a configuration can be achieved by, for example, having the charging switch 408 not be engaged if either of the UP_PULSE switch 424 and the DN_PULSE switch 426 is engaged.

In some embodiments, the capacitor C is substantially fully drained before the charging switch 408 is engaged. In some embodiments, when current is flowing to or from the loop filter 180, C is not charging or draining, respectively. For example, when UP_PULSE_ON or DN_PULSE_ON is high, each of CHARGE and DRAIN is low. As described herein in the context of generation of a CHARGE signal provided to the charging switch 408, it is noted that UP is AND'ed (403) with the inverse of UP_PULSE_ON, and DN is AND'ed (405) with the inverse of DN_PULSE_ON. The resulting signals are OR'ed together (402) to generate the CHARGE. A result of such a configuration is that when UP_PULSE_ON or DN_PULSE_ON is high, CHARGE is low. Such a configuration can ensure a substantially constant current amplitude when the UP_PULSE switch 424 or the DN_PULSE switch 426 is closed.

Gain ($k_{phase}$) and maximum phase error associated with a PFD with FWVACP, such as the example of FIGS. 19 and 20, can be obtained. Current $I_1$ charges capacitor C for time $\Delta t$ which can be related to a phase error $\theta_e$ between $F_{ref}$ and $F_{fb}$ and the reference period $T_{ref}$ as follows:

$$\Delta t = \left(\frac{\theta_e}{2\pi}\right)(T_{ref}). \qquad (9)$$

Charge q is accumulated on C during time $\Delta t$ and the voltage after time $\Delta t$ can be expressed as follows:

$$V = \frac{q}{C} = \frac{I_1 \Delta t}{C} = \left(\frac{I_1}{C}\right)\left(\frac{\theta_e}{2\pi}\right)(T_{ref}). \qquad (10)$$

Current from the FWVACP $I_2$ is directly proportional to voltage V which in turn is proportional to the phase error $\theta_e$. $I_2$ can be expressed as:

$$I_2 = KV = \frac{KI_1}{C}\frac{\theta_e}{2\pi}(T_{ref}), \qquad (11)$$

where K is a constant of proportionality between voltage V and current $I_2$.

An average charge pump (CP) current $I_{ave}$ can be determined by the fraction, $t_{pulse}$ of the reference period for which current is flowing onto the loop filter (180 in FIG. 19). The quantity $t_{pulse}$ can be a constant which is determined by the desired pulse width as described herein. The average CP current can be expressed as:

$$I_{ave} = I_2 \cdot \left(\frac{t_{pulse}}{T_{ref}}\right) = \frac{KI_1}{C}\frac{\theta_e}{2\pi}(T_{ref}) \cdot \left(\frac{t_{pulse}}{T_{ref}}\right). \qquad (12)$$

The PFD gain $k_{phase}$ can then be determined using the average CP current and the phase error:

$$k_{phase} = \frac{I_{ave}}{\theta_e} = \frac{KI_1 t_{pulse}}{2\pi C}. \qquad (13)$$

Figure 21:
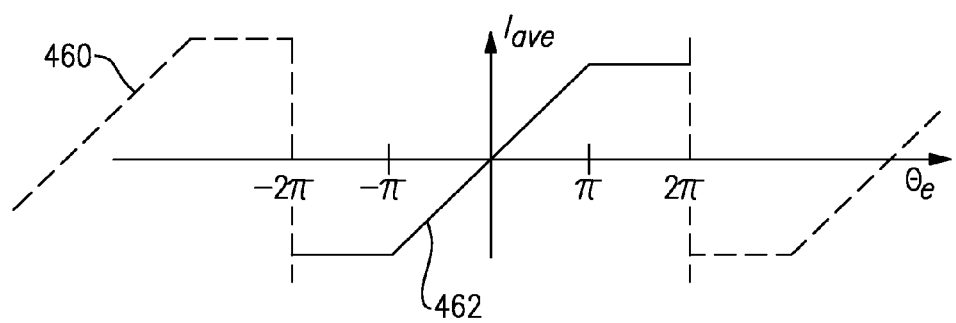
FIG. 21 an example profile of an average charge pump current plotted as a function of the phase difference.

In FIG. 21, an example of the average current $I_{ave}$ (460) is plotted as a function of the phase difference $q_e$. In some applications, such a result can be viewed as a transfer function of the FWVACP. For example, the capacitor C charges for a maximum time equal to half the reference period (equivalent to a phase error of $\pi$). Even if the phase error is larger than $\pi$, the charging switch (408 in FIG. 19) can open to allow a constant amplitude current to be delivered to the loop filter 180. Such a configuration can be a reason for the flat region of the transfer function shown in FIG. 21. In the example, the maximum phase error is $2\pi$, after which the pattern repeats.

As described herein, one or more features of the present disclosure relates to a technique for eliminating reference spurs in a Frac-N PLL. Such a technique can be implemented by manipulating the charge pump pulse in such a way that it has a substantially constant width and occurs periodically. Phase error information can be embedded in the amplitude of the pulse. In some implementations, additional frequencies outside the first reference frequency may also be targeted by setting the width of the pulse.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation (s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A control system for a frequency synthesizer of a wireless device, the control system comprising:
    a phase detector configured to receive a reference signal and a feedback signal, the phase detector further configured to generate a first signal representative of a phase difference between the reference signal and the feedback signal;
    a charge pump in communication with the phase detector, the charge pump configured to generate a current signal based at least in part on the first signal, the charge pump further configured to charge a capacitance element upon receipt of a charge signal such that the charged capacitance has a voltage representative of the phase difference;
    a loop filter configured to receive the current signal and generate a corresponding voltage signal, the charge signal resulting from a logic operation between the first signal and a switch signal corresponding to the first signal, the switch signal configured to allow the loop filter to receive the current signal; and
    an oscillator configured to receive the voltage signal from the loop filter and generate an output signal based on the voltage signal, the voltage signal configured to reduce or substantially eliminate one or more spurs associated with the frequency synthesizer.

2. The control system of claim 1 wherein the one or more spurs includes one or more reference spurs.

3. The control system of claim 1 wherein the current signal includes a pulse with a substantially constant width and an amplitude representative of the phase difference.

4. The control system of claim 3 wherein the phase detector is configured to generate an up (UP) signal or a down (DN) signal as the first signal, the UP signal being generated when a phase of the reference signal leads a phase of the feedback signal, the DN signal being generated when a phase of the reference signal lags a phase of the feedback signal.

5. The control system of claim 1 wherein the logic operation includes an AND operation between the first signal and an inverse of the switch signal.

6. The control system of claim 1 wherein the charging circuit charge pump includes a charging switch configured to facilitate the charging of the capacitance element, and a drain switch configured to facilitate draining of the charge in the capacitance element.

7. The control system of claim 6 wherein the charging switch and the drain switch are in their respective states to inhibit charging of the capacitance element and to inhibit draining of the capacitance element, respectively, when the loop filter is receiving the current signal.

8. The control system of claim 1 wherein the charge pump includes a first current source configured to generate a positive current as the current signal for an up (UP) signal and a second current source configured to generate a negative current as the current signal for a down (DN) signal, the UP or DN signal being generated by the phase detector when a phase of the reference signal leads or lags a phase of the feedback signal, respectively.

9. The control system of claim 8 wherein the current signal is modulated based on a combination of the UP signal and a pulse signal or a combination of the DN signal and the pulse signal.

10. The control system of claim 9 wherein the pulse signal is generated from the reference signal such that the pulse signal has substantially same frequency as the reference signal.

11. The control system of claim 10 wherein the combination of the UP signal and the pulse signal includes an AND combination of the pulse signal and an UP_TOGGLE signal that results from a flip-flop operation between the UP signal and an inverse of the pulse signal.

12. The control system of claim 11 wherein the combination of the DN signal and the pulse signal includes an AND combination of the pulse signal and a DN_TOGGLE signal that results from a flip-flop operation between the DN signal and an inverse of the pulse signal.

13. The control system of claim 12 wherein the charge pump further includes a first switch in communication with the first current source and a second switch in communication with the second current source, the first and second switches configured to be controlled to provide the modulation of the current signal.

14. The control system of claim 13 wherein the first switch or the second switch is engaged only when the capacitance element has a substantially full charge.

15. The control system of claim 1 further comprising a divider circuit in communication with the oscillator and the phase detector, the divider circuit configured to receive the output signal from the oscillator and generate an updated version of the feedback signal.

16. The control system of claim 15 further comprising a sigma delta modulator (SDM) in communication with the divider circuit to form a loop, the loop being configured to allow the output signal to have an output frequency that is a non-integer multiple of the frequency of the reference signal.

17. A wireless device comprising:
an antenna configured to facilitate reception of a radio-frequency (RF) signal;
a receiver in communication with the antenna, the receiver configured to process the RF signal; and
a frequency synthesizer in communication with the receiver, the frequency synthesizer having a control system that includes a phase detector configured to receive a reference signal and a feedback signal, the phase detector further configured to generate a first signal representative of a phase difference between the reference signal and the feedback signal, the control system further including a charge pump in communication with the phase detector, the charge pump configured to generate a current signal based at least in part on the first signal, the charge pump further configured to charge a capacitance element upon receipt of a charge signal such that the charged capacitance has a voltage representative of the phase difference, the control system further including a loop filter configured to receive the current signal and generate a corresponding voltage signal, the charge signal resulting from a logic operation between the first signal and a switch signal corresponding to the first signal, the switch signal configured to allow the loop filter to receive the current signal, the control system further including an oscillator configured to receive the voltage signal from the loop filter and generate an output signal based on the voltage signal, the voltage signal configured to reduce or substantially eliminate one or more spurs associated with the frequency synthesizer.

* * * * *